(12) United States Patent
Yeh et al.

(10) Patent No.: US 11,111,584 B2
(45) Date of Patent: *Sep. 7, 2021

(54) METHOD AND SYSTEM FOR GROWTH OF GRAPHENE NANOSTRIPES BY PLASMA ENHANCED CHEMICAL VAPOR DEPOSITION

(71) Applicant: California Institute of Technology, Pasadena, CA (US)

(72) Inventors: Nai-Chang Yeh, Pasadena, CA (US); Chen-Chih Hsu, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/659,339

(22) Filed: Oct. 21, 2019

(65) Prior Publication Data

US 2020/0048769 A1 Feb. 13, 2020

Related U.S. Application Data

(62) Division of application No. 15/900,517, filed on Feb. 20, 2018, now Pat. No. 10,465,291.

(Continued)

(51) Int. Cl.
*C23C 16/26* (2006.01)
*C23C 16/513* (2006.01)
(Continued)

(52) U.S. Cl.
CPC .............. *C23C 16/513* (2013.01); *C01B 7/01* (2013.01); *C01B 32/186* (2017.08); *C23C 16/26* (2013.01);
(Continued)

(58) Field of Classification Search
CPC ...................................................... C23C 16/00
See application file for complete search history.

(56) References Cited

U.S. PATENT DOCUMENTS

2013/0330523 A1* 12/2013 Zhang .................... B82Y 30/00
428/195.1
2015/0079342 A1* 3/2015 Boyd .................... C01B 32/184
428/141

OTHER PUBLICATIONS

Maboya et al. The snyethesis of carbon nanomaterials using chlorinated hydrocarbons over Fe—Co/CaCO3 catalyst. S. Afr. J. Chem, 2016, 69, 15-26. (Year: 2016).*

(Continued)

*Primary Examiner* — David P Turocy
(74) *Attorney, Agent, or Firm* — Kilpatrick Townsend & Stockton LLP

(57) ABSTRACT

A method of forming vertical graphene nanostripes comprising one or several monolayers and characterized by a thickness normal to the one or several monolayers, a length orthogonal to the thickness, and a width orthogonal to the thickness includes providing a substrate, subjecting the substrate to a reduced pressure environment in a processing chamber, and providing methane gas and $C_6$-containing precursor. The method also includes flowing the methane gas and the $C_6$-containing precursor into the processing chamber, establishing a partial pressure ratio of the $C_6$-containing precursor to methane gas in the processing chamber, and generating a plasma. The method further includes exposing at least a portion of the substrate to the methane gas, the $C_6$-containing precursor, and the plasma and growing the vertical graphene nanostripes coupled to the at least a portion of the substrate, wherein the thickness of the vertical graphene nanostripes extends parallel to the substrate.

20 Claims, 17 Drawing Sheets

Related U.S. Application Data

(60) Provisional application No. 62/563,246, filed on Sep. 26, 2017.

(51) Int. Cl.
  *C01B 7/01*    (2006.01)
  *C01B 32/186*  (2017.01)
  *C23C 16/50*   (2006.01)
  *C23C 16/44*   (2006.01)

(52) U.S. Cl.
  CPC .......... *C23C 16/4418* (2013.01); *C23C 16/50* (2013.01); *C01B 2204/06* (2013.01)

(56) References Cited

OTHER PUBLICATIONS

Yang, Kathleen. Growth and Characterization of Graphene Nanoribbons from PECVD and Different Carbon-Based Molecules. Available Youtube Jan. 2017. (Year: 2017).*

U.S. Appl. No. 15/900,517, "Final Office Action", dated Dec. 17, 2018, 12 pages.

U.S. Appl. No. 15/900,517, "Non-Final Office Action", dated Jul. 2, 2019, 11 pages.

U.S. Appl. No. 15/900,517, "Non-Final Office Action", dated Aug. 29, 2018, 9 pages.

U.S. Appl. No. 15/900,517, "Notice of Allowance", dated Sep. 17, 2019, 8 pages.

U.S. Appl. No. 15/900,517, "Restriction Requirement", dated May 23, 2018, 7 pages.

Maboya et al., "The Synthesis of Carbon Nanomaterials Using Chlorinated Hydrocarbons over a Fe—Co/CaCO3 Catalyst", South African Journal of Chemistry, vol. 69, Availabe online at: http://journals.sabinet.co.za/sajchem/, Jan. 2016, pp. 15-26.

Yang, "Growth and Characterization of Graphene Nanoribbons From PECVD and Different Carbon-Based Molecules", Available online at: https://www.youtube.com/watch?v=RmEZRzcXw-A, Jan. 2017, 21 pages.

Yeh, "A New World Composed of Graphene-Based Technology", Available online at: https://www.youtube.com/watch?v=c4oW6PcOUtc and https://www.ted.com/tedx/events/19113, Dec. 25, 2016, 16 pages.

Jang et al., "Low-Temperature-Grown Continuous Graphene Films From Benzene by Chemical Vapor Deposition at Ambient Pressure", Scientific Reports, vol. 5, No. 1, Dec. 10, 2015, pp. 1-7.

* cited by examiner

→ HCl

Repeat steps

Excess DCB saturates zigzag edge

Methane plasma fills in graphene lattice

Chlorine plasma attacks strained graphene sites

METHOD AND SYSTEM FOR GROWTH OF GRAPHENE NANOSTRIPES BY PLASMA ENHANCED CHEMICAL VAPOR DEPOSITION

CROSS-REFERENCES TO RELATED APPLICATIONS

This application is a divisional application of U.S. patent application Ser. No. 15/900,517, filed on Feb. 20, 2018, entitled "Method and System for Growth of Graphene Nanostripes by Plasma Enhanced Chemical Vapor Deposition," which claims priority to U.S. Provisional Patent Application No. 62/563,246, filed on Sep. 26, 2017, entitled "High-yield Single-step Low-temperature Catalytic Growth of Graphene Nanoribbons by Plasma Enhanced Chemical Vapor Deposition," the disclosures of which are hereby incorporated by reference in their entirety for all purposes.

STATEMENT AS TO RIGHTS TO INVENTIONS MADE UNDER FEDERALLY SPONSORED RESEARCH OR DEVELOPMENT

N/A

BACKGROUND OF THE INVENTION

Graphene, a monolayer of carbon atoms forming a two-dimensional honeycomb lattice structure, is considered a wonder material for both scientific research and technological applications. Its unique electronic, thermal, and mechanical properties and compatibility with lithographic techniques are ideal for many nano-electronic, spintronic, and mechanical applications; it is also promising for large-area optoelectronic devices such as touch screen displays and electrodes for photovoltaic cells and light emitting diodes.

Graphene has been produced by exfoliation from graphite. However, graphene produced in this manner is not suitable for many applications due to its inherently small size and the non-scalability of the process. Thermal CVD based on catalytic dehydrogenation of carbon precursors (e.g. methane) on transition metals (e.g. Cu, Ni, Pt, Co) is capable of producing graphene of technologically relevant scales. However, the need for multiple steps and high temperatures (~1000° C.) is incompatible with device fabrication and integration.

Despite the progress made related to the formation of graphene films, there is a need in the art for improved methods and systems related to graphene production.

SUMMARY OF THE INVENTION

The present invention relates generally to methods and systems for material synthesis. More specifically, the present invention relates to methods and systems for growing high quality graphene nanostripes using a high-yield, single-step, low-temperature catalytic growth process. Merely by way of example, the invention has been applied to a method of growing graphene nanostripes. The methods and techniques can be applied to a variety of graphene growth systems including CMOS compatible semiconductor growth processes.

According to embodiments of the present invention, methods and systems for the growth of graphene nanostripes (GNSPs) in a single-step process are provided. As described herein, one or more substituted aromatics (e.g., 1,2-dichlorobenzene) are utilized as precursors during a plasma enhanced chemical vapor deposition (PECVD) process that does not require active heating of the growth chamber. Using low plasma power (e.g., ≤60 W) with a plasma size of 1~2 cm$^3$, GNSPs can be grown vertically with high yields, for example, up to (13±4) g/m$^2$ in short time periods (e.g., 20 minutes). These GNSPs exhibit high aspect ratios (from 10:1 to ~130:1) and widths from tens to hundreds of nanometers on various transition-metal substrates. The inventors have demonstrated that the morphology, electronic properties, and yields of the GNSPs can be controlled by the growth parameters (e.g., the species of seeding molecules, compositions, and flow rates of the gases introduced into the plasma, plasma power, the growth time, and the like).

In summary, we have developed a new high-yield single-step method for growing large quantity GNSPs on various transition-metal substrates by means of PECVD and aromatic precursors such as 1,2-dichlorobenzene (1,2-DCB) molecules. This efficient growth method does not require any active heating and can reproducibly produce a high yield of ~10 g/m$^2$ within 20 minutes at a relative low plasma power of ≤60 W for a plasma size of 1~2 cm$^3$. Moreover, the GNSPs thus produced can be easily transferred from the growth substrate to any other substrates. Therefore, this new growth method is highly promising for mass production of GNSPs. From studies of the Raman spectra, scanning electron microscopy (SEM) images, ultraviolet photoemission spectroscopy (UPS), transmission electron microscopy (TEM) images, energy dispersion x-ray spectroscopy (EDS) and electrical conductivity of these GNSPs as functions of the growth parameters, we have also confirmed the high-quality of these GNSPs with electrical mobility ~10$^4$ cm$^2$/V-s and found the correlation of the properties of GNSPs with the growth parameters. Based on our experimental findings, we propose a growth and branching mechanism of GNSPs that suggests the important role of the 1,2-DCB precursor molecules in initiating the vertical growth and determining the morphology of GNSPs. These findings therefore open up a new pathway to large-scale, inexpensive mass production of high-quality GNSPs for such large-scale applications as supercapacitors and photovoltaic cells.

In comparison with our single-step PECVD growth process of high-quality large graphene sheets laterally on copper substrates without active heating, these GNSPs of large aspect ratios are grown vertically on various transition-metal substrates by PECVD with the addition of substituted aromatics such as 1,2-dichlorobenzene (1,2-DCB), 1,2-dibromobenzene (1,2-DBB), 1,8-dibromonaphthalene (1,8-DBN) and toluene as the seeding molecules. Among these substituted aromatics, we find that 1,2-dichlorobenzene (1,2-DCB) is most effective for the growth of GNSPs at room temperature. Therefore, we focus hereafter on the studies of PECVD-grown GNSPs that are seeded by 1,2-DCB. The entire growth process occurs in a single step within less than 20 minutes at a relatively low plasma power (≤60 W for a plasma size of 1~2 cm$^3$), and the resulting GNSPs exhibit large aspect ratios and high yields. Studies of the Raman spectroscopy, scanning electron microscopy (SEM), transmission electron microscopy (TEM), energy dispersion x-ray spectroscopy (EDS), ultraviolet photoemission spectroscopy (UPS) and electrical conductivity all confirm the high quality of the GNSPs thus obtained. Based on these experimental findings together with data from the residual gas analyzer (RGA) spectra and optical emission spectroscopy (OES) taken during the plasma process, we propose a growth mechanism and suggest that the introduction of substituted aromatics in the hydrogen plasma plays a critical role in achieving rapid vertical growth of GNSPs with high aspect ratios.

According to an embodiment of the present invention, a method of forming graphene nanostripes is provided. The method includes providing a substrate comprising at least one of copper foil or nickel foam, subjecting the substrate to a reduced pressure environment in a processing chamber, and providing methane gas and 1,2-dichlorobenzene (1,2-DCB) gas. The method also includes flowing the methane gas and the 1,2-DCB into the processing chamber and establishing a partial pressure ratio of 1,2-DCB gas to methane gas in the processing chamber. The partial pressure ratio is between 0 and 3. The method further includes generating a plasma, thereafter, exposing the at least a portion of the substrate to the methane gas, the 1,2-DCB gas, and the plasma, and growing the graphene nanostripes coupled to the at least a portion of the substrate.

According to another embodiment of the present invention, a method of forming graphene nanostripes is provided. The method includes providing a transition-metal substrate, subjecting the transition-metal substrate to a reduced pressure environment, and providing methane gas and a C6-containing precursor. The method also includes exposing at least a portion of the transition-metal substrate to the methane gas and the C6-containing precursor, generating a plasma, exposing the at least a portion of the transition-metal substrate to the methane gas, the C6-containing precursor, and the plasma, and growing the graphene nanostripes coupled to the at least a portion of the transition-metal substrate.

According to a specific embodiment of the present invention, a method of forming graphene nanostripes is provided. The method includes providing a substrate, subjecting the substrate to a reduced pressure environment, and providing methane gas. The method also includes heating a furnace to provide 1,8-dibromonaphthalene, exposing at least a portion of the substrate to the methane gas and the 1,8-dibromonaphthalene, and generating a plasma. The method further includes exposing the at least a portion of the substrate to the methane gas, the 1,8-dibromonaphthalene, and the plasma and growing graphene nanostripes coupled to the at least a portion of the substrate.

Numerous benefits are achieved by way of the present invention over conventional techniques. For example, embodiments of the present invention provide techniques for producing graphene nanostripes that are useful for a variety of applications including energy storage, photovoltaic energy harvesting, wide-band photon detection, and conducting composite materials. Embodiments of the present invention can be used to grow GNSPs without active heating so as to significantly reduce the thermal budget for material fabrication. Additionally, embodiments increase the manufacturing throughput due to the single-step growth process associated with the seeded PECVD method of this invention versus typical thermal CVD processes reported by others to date. Moreover, embodiments enable the growth of high aspect ratio graphene nanostripes with high production yields and high electrical mobility in comparison with thermal CVD processes.

These and other embodiments of the invention along with many of its advantages and features are described in more detail in conjunction with the text below and attached figures.

DETAILED DESCRIPTION OF SPECIFIC EMBODIMENTS

The present invention relates generally to methods and systems for material synthesis. More specifically, the present invention relates to methods and systems for growing high quality graphene nanostripes using a high-yield, single-step, low-temperature catalytic growth process. The methods and techniques can be applied to a variety of graphene growth systems including CMOS compatible semiconductor growth processes.

Without limiting embodiments of the present invention, we refer to structures described herein as graphene nanostripes, to indicate their large aspect ratios and to differentiate these graphene nanostripes from graphene nanostripes that exhibit quantum confinement and from graphene nanosheets or nanowalls that are generally wider than the graphene nanostripes discussed herein.

Figure 1:
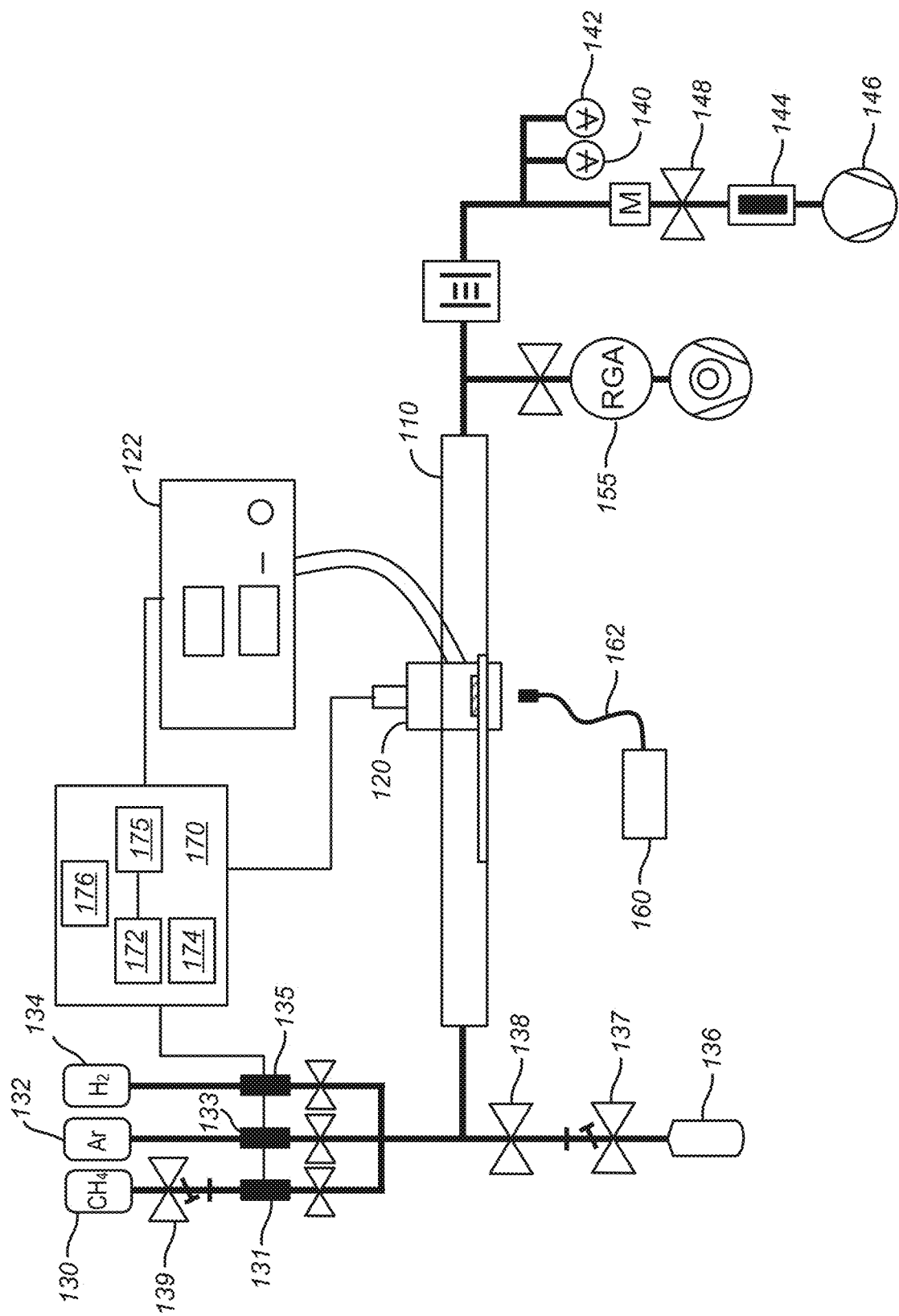
FIG. 1 is a simplified schematic diagram illustrating a PECVD system for growing graphene nanostripes according to an embodiment of the present invention.

FIG. 1 is a simplified schematic diagram illustrating a PECVD system for growing graphene nanostripes according to an embodiment of the present invention. As illustrated in FIG. 1, the system includes a processing chamber 110. The processing chamber can also be referred to as a processing tube. The processing chamber is fabricated from materials such as quartz that provide a non-reactive environment that will sustain plasma generation. In addition to quartz, other materials, including alumina, glass, and the like can be utilized in fabricating the processing chamber. An RF plasma reactor 120 (e.g., an Evenson cavity suitable for generating a microwave plasma) and an associated power supply 122 (e.g., available from Opthos Instruments Inc.) are provided in order to generate an RF plasma (e.g., a microwave plasma in the ultra-high frequency (UHF) portion of the RF spectrum, for example at 2.45 GHz) in a portion of the processing chamber 110. The portion of the processing chamber can include all or a fraction of the processing chamber depending on the particular implementation.

Gas sources 130, 132, and 134 are illustrated in FIG. 1 and can include fewer or a greater number of sources. In the illustrated embodiment, the gas sources are $CH_4$, Ar, and $H_2$, although the present invention is not limited to these particular gases. Mass flow controllers (MFCs) 131, 133, and 135 or other suitable flow controllers are utilized to control the flow rate of the gases from the gas sources to the processing chamber. Additionally, a carbon containing precursor, including 1,2-dichlorobenzene (1,2-DCB) or 1,2-dibromobenzene (1,2-DBB) is stored in a quartz container 136 and attached to the processing chamber via a leak valve 137 and a quarter-turn, shut-off valve 138.

An additional leak valve 139 is illustrated in FIG. 1 and can be used to control the flow of the carbon source at levels below that provided by MFCs. In some embodiments, MFC 135 is operated in an open condition and the flow of the carbon source can be controlled using a feedback loop incorporating a feedback signal from optical spectrometer 160. Alternatively, a pre-mixture of $H_2$ and $CH_4$ (or other suitable carbon source) could be utilized. Accordingly, some embodiments utilize the optical emission spectra to adjust the amount of the carbon source (e.g., methane) in the stream since the optical emission spectra can be sensitive to very small changes in the position of the leak valve.

In order to monitor the pressure in the processing chamber 110, one or more pressure gauges 140 and 142 can be utilized in the vacuum lines leading to the foreline trap 144 and the vacuum pump 146. Additional vacuum elements can be utilized as appropriate to the particular application. Additionally, one or more vacuum control valves 148 can be utilized to control the pressure in the processing chamber.

In order to provide for characterization of the processing environment and the graphene formation process, an optical emission spectrometer (OES) 160 is provided, illustrated as optically coupled to the processing chamber using a fiber optic cable 162. In addition to an OES, which can be used to control and adjust the amount of the carbon source in the flow stream, the OES can be used to measure the emission peaks of gases present in the processing chamber. In some embodiments, a ratio of a set of emission peaks can be used to monitor the growth process and produce consistent results. In some implementations, a residual gas analyzer (RGA) 155 is used to monitor the carbon containing precursor and by-products partial pressure. Alternatively, an optical pyrometer can be used to measure the sample temperature. In some embodiments, an optical inspection system (for example, a mirror that provides optical access to one or more surfaces of the substrate) is utilized during growth to characterize the state of copper removal. Thus, in addition to an optical spectrometer, other optical inspection techniques are included within the scope of the present invention.

A computer 170 including a processor 172 and computer readable medium 174 is provided and coupled to the MFCs, the vacuum control valve 148, the RF plasma generator 120 and power supply 122, the OES 160, and other suitable system components in order to provide for control of the various system components. In some implementations, fewer or more components can be coupled to the computer. The processor 172 is used to perform calculations related to controlling at least some of the vacuum pressure, gas flow rates, plasma generation, and other system parameters. A computer readable medium 174 (also referred to as a database or a memory) is coupled to the processor 172 in order to store data used by the processor and other system elements. The processor 172 interacts with the optical spectrometer 160 in some embodiments, which provides data on the state of the substrate cleaning process, graphene deposition process, and the like. Using the processor 172, the memory 174, and the I/O interface 176, a user is able to operate the system to form graphene as described herein.

The processor 172 can be a general purpose microprocessor configured to execute instructions and data, such as a microprocessor manufactured by the Intel Corporation of Santa Clara, Calif. It can also be an Application Specific Integrated Circuit (ASIC) that embodies at least part of the instructions for performing the method in accordance with the present invention in software, firmware and/or hardware. As an example, such processors include dedicated circuitry, ASICs, combinatorial logic, other programmable processors, combinations thereof, and the like.

The memory 174 can be local or distributed as appropriate to the particular application. Memory 174 may include a number of memories including a main random access memory (RAM) for storage of instructions and data during program execution and a read only memory (ROM) in which fixed instructions are stored. Thus, memory 174 provides persistent (non-volatile) storage for program and data files, and may include a hard disk drive, flash memory, a floppy disk drive along with associated removable media, a Compact Disk Read Only Memory (CD-ROM) drive, an optical drive, removable media cartridges, and other like storage media.

Figure 2:
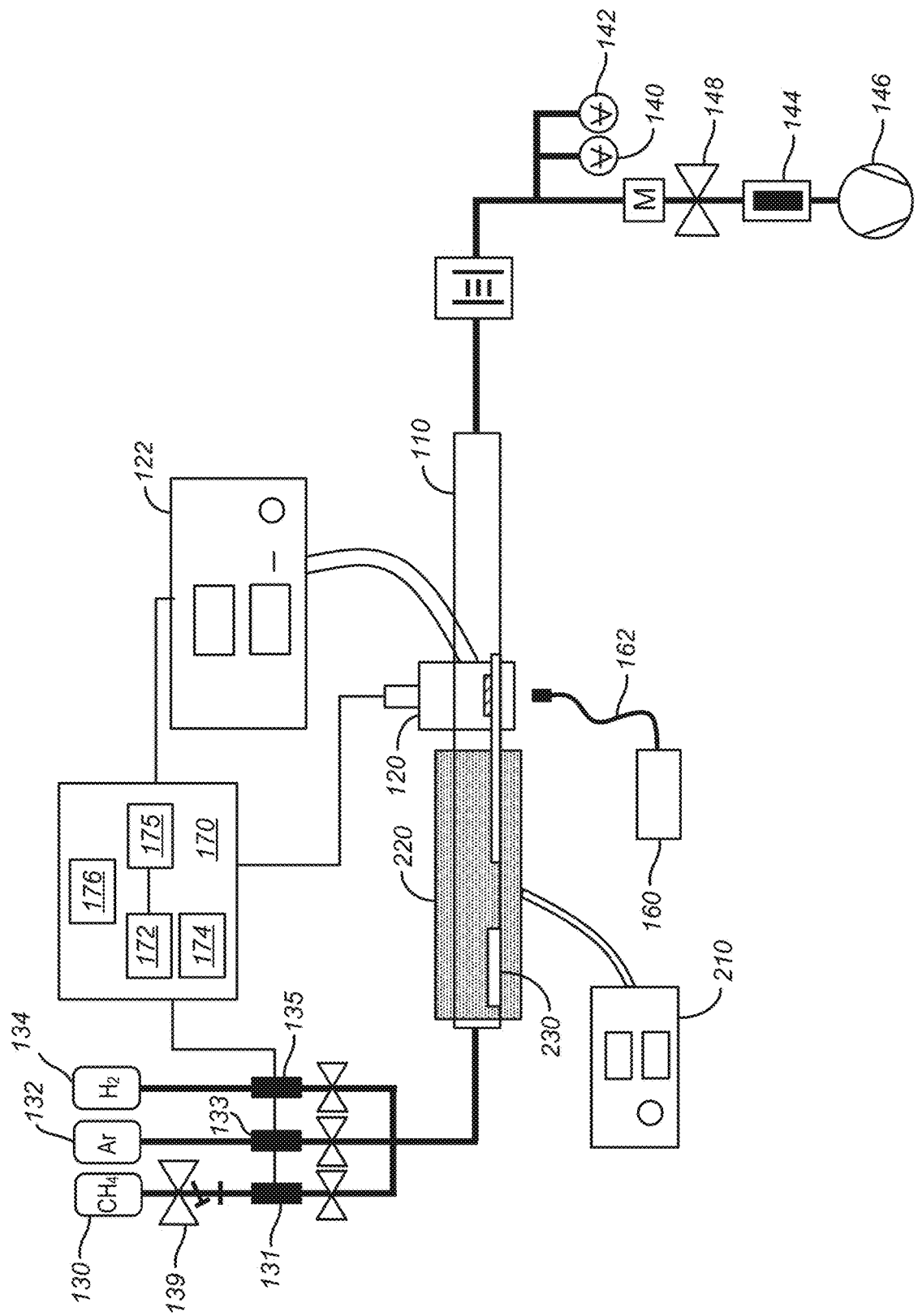
FIG. 2 is a simplified schematic diagram illustrating a PECVD system for growing graphene nanostripes according to another embodiment of the present invention.

FIG. 2 is a simplified schematic diagram illustrating a PECVD system for growing graphene nanostripes according to another embodiment of the present invention. In the embodiment illustrated in FIG. 2, a temperature controller 210 and a furnace 220 in which the carbon containing precursor (e.g., 1,8-dibromonaphthalene (1,8-DBN)) can be placed in solid form on support 230. Heating of the furnace under control of the temperature controller can produce the appropriate amount of the carbon containing precursor in the vapor phase. Accordingly, embodiments of the present invention can utilize solid-phase and liquid-phase carbon containing precursors as well as gas-phase precursors.

Figure 3:
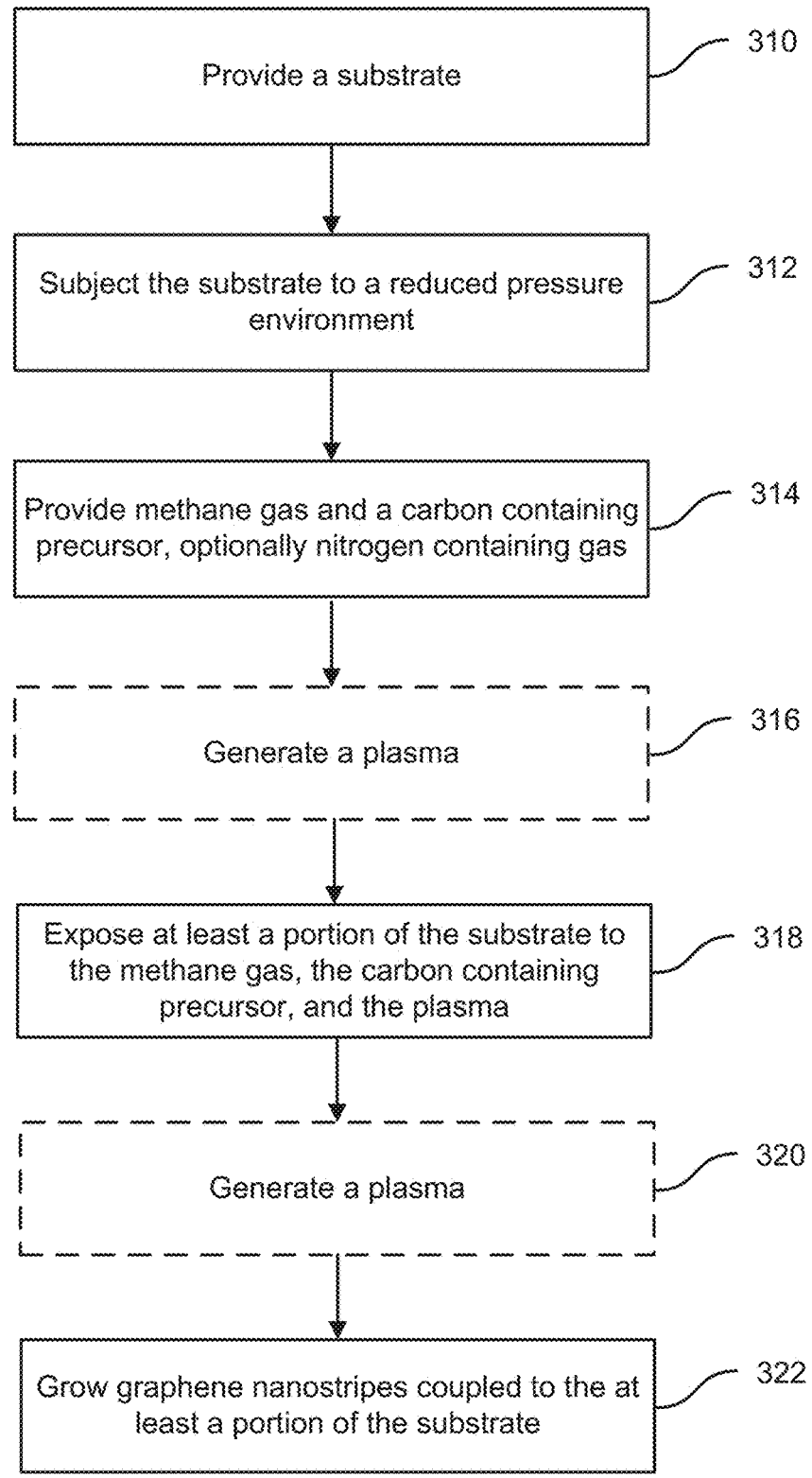
FIG. 3 is a simplified flowchart illustrating a method of growing graphene nanostripes according to an embodiment of the present invention.

FIG. 3 is a simplified flowchart illustrating a method of growing graphene nanostripes according to an embodiment of the present invention. The method 300 includes providing a substrate (310) and subjecting the substrate to a reduced pressure environment (312). In an embodiment, the processing chamber was pumped down to 27 mTorr. During the growth of the graphene nanostripes, the total pressure in the processing chamber was maintained at 500 mTorr with 2 sccm hydrogen utilized as a carrier gas. The method also includes providing methane gas and a carbon containing precursor (314) and generating a plasma (316). The partial pressure ratio of the methane gas and the carbon containing precursor (e.g., 1,2-DCB) was controlled, as discussed above, by operation of precision leak valves 137 and 139. The partial pressure of the gases in the processing chamber was monitored by use of RGA 155. Typical methane and 1,2-DCB partial pressures were $(10~900) \times 10^{-9}$ Torr and $(1~10) \times 10^{-9}$ Torr, respectively (this is the pressure in the RGA). For remote plasma operation, hydrogen plasma was formed away the substrate and then moved to the substrate in order to prevent any plasma transient damages. Typical plasma power ranges from 4060 W and growth time ranges from 5~20 minutes were utilized in some embodiments. As discussed below, the gas flows can be initiated and stabilized before the plasma is generated (i.e., 318/320) or the plasma can be turned on prior to the gas flows are initiated (316/318).

The method further includes exposing at least a portion of the substrate to at least the methane gas, the carbon containing precursor, and the plasma (318). The growth of graphene nanostripes coupled to the at least a portion of the substrate results (322).

Embodiments of the present invention contrast with vertical graphene sheets that are grown after pretreatment of the substrates and additional substrate heating from 500° C. to 1000° C. since embodiments of the present invention utilize a single-step, low-power growth process that requires neither active heating nor pretreatment of the substrates through the use of carbon containing precursors (e.g., 1,2-DCB) as seeding molecules for the vertical growth of graphene nanostripes.

Figure 4A:
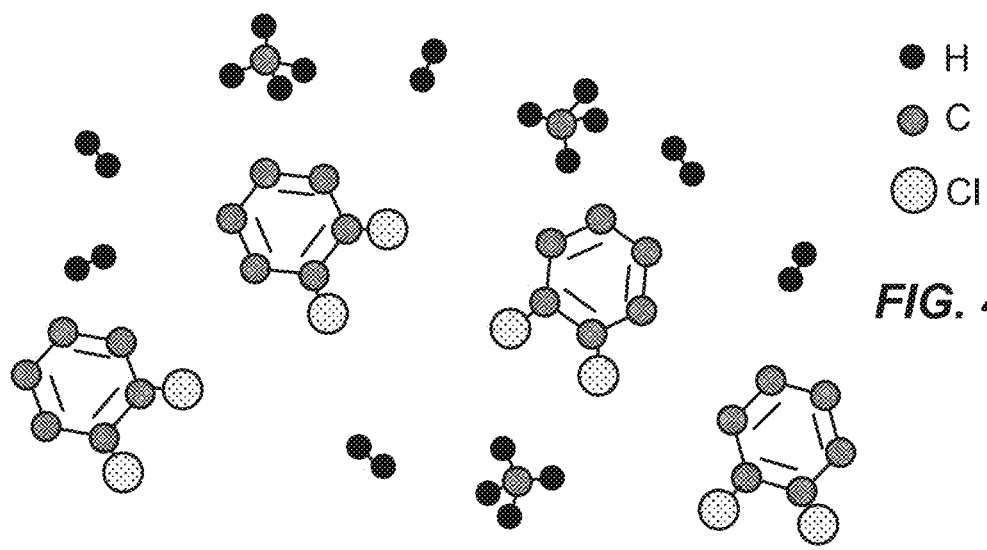
FIGS. 4A-4C are simplified schematic diagrams illustrating a seeded growth process for graphene nanostripes according to an embodiment of the present invention.
Figure 4B:
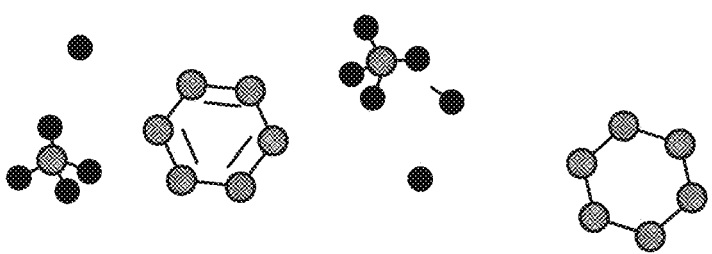
Figure 4C:
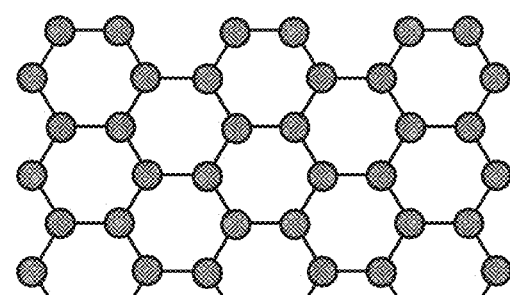

FIGS. 4A-4C are simplified schematic diagrams illustrating a seeded growth process for graphene nanostripes according to an embodiment of the present invention. In FIGS. 4A-4C, 1,2-DCB is used as seeds for vertically aligned carpets of graphene nanostripes grown on Cu surfaces, but other carbon containing precursors including $C_6$ containing precursors can be utilized, including carbon based, substituted aromatics such as 1,2-dibromobenzene (1,2-DBB), 1,8-dibromonaphthalene (1,8-DBN), and toluene. Additionally, substrates other than copper foil, including transition metal substrates such as nickel foam, Ni foil, cobalt, or platinum can be utilized.

The hydrogen plasma with a slight trace of CN radicals is used to remove the surface copper oxide and expose a fresh copper surface upon which the 1,2-DCB molecules can seed, resulting in the initial formation of vertical graphene nanostripes. Additionally, methane is introduced into the hydrogen plasma as another carbon source to enhance the growth rate. In some embodiments, hydrogen is utilized as a carrier gas.

The inventors believe, without limiting embodiments of the present invention, that atomic hydrogen and CN radicals are the plasma species acting upon copper during the PECVD graphene nanostripe growth process. Atomic hydrogen is produced via the hydrogen plasma and removes native atmospheric derived species including $Cu_2O$, $CuO$, $Cu(OH)_2$, and $CuCO_3$. The CN radicals are highly reactive with and remove copper prior to and during graphene growth. Thus, the presence of both atomic hydrogen and CN radicals in the plasma enables the concurrent (e.g., simultaneous) preparation of the copper surface and deposition of high quality graphene at reduced temperatures. In addition to CN radicals, other nitrogen oxides, nitrogen oxide radicals, carbon oxides, and/or carbon oxide radicals (e.g., CO, CH, CN, NO, and the like) can be present in the chamber during growth and provide reactive functionality. As discussed in additional detail in relation to FIG. 11, CN and HCN partial pressures measured during graphene nanostripe growth and coincident with plasma generation in the processing chamber indicate the activity associated with the cyano radicals.

In FIG. 4B, benzene rings are formed as chlorine is removed from 1,2, DCB by the plasma to form HCl and the benzene rings. The addition of additional benzene rings results in growth of the graphene nanostripe as illustrated in FIG. 4C.

In contrast with conventional thermal growth techniques, embodiments of the present invention utilize carbon containing precursors that have single benzene ring structures, thereby enabling integration of not just $C_2$ radicals, but also $C_6H_6$ molecules into the matrix of the graphene nanostripe after plasma enhanced decomposition of the single benzene ring precursor. Additional description related to both $C_6$ radicals and $C_6H_6$ molecules is provided in relation to FIGS. 10 and 12.

Additionally, embodiments of the present invention utilize low temperature, CMOS compatible plasma enhanced growth processes that eliminate technological limitations imposed by thermal CVD processes, enabling graphene nanostripe growth that is suitable for integration with complementary metal-oxide-semiconductor (CMOS) microelectronic fabrication processes and technology. Since conventional thermal CVD graphene growth processes operate in temperature ranges exceeding 800° C., these thermal CVD growth processes are incompatible with standard CMOS processes that operate at temperatures less than 450° C. For example, the low temperature, e.g., less than 450° C. growth processes described herein are compatible with temperature restrictions to protect metal interconnects, prevent diffusion of implanted dopant species, and the like fabricated during a CMOS process. It should be noted that the low temperature process utilized according to embodiments of the present invention enables the use of plastic substrates, for example, plastic coated with an appropriate metal that can be used as a flexible device.

FIGS. 4D-4J are simplified schematic diagrams illustrating a mechanism for growth and branching of graphene nanostripes according to an embodiment of the present invention. As illustrated in FIGS. 4D-4J, a growth mechanism along the zigzag edges of graphene nanostripes is shows. A similar mechanism may take place along the armchair edge, but at a slower rate due to steric hindrance of both edge chlorination (chemical activation) and 1,2-DCB attachment. Alternatively, 1,2-DCB molecules may selectively attach to zigzag edges while carbon radicals attach to both armchair and zigzag edges as has been proposed in the growth of vertically oriented graphene sheets. Either case is consistent with the large aspect ratios of the graphene nanostripes described herein.

Figure 10:
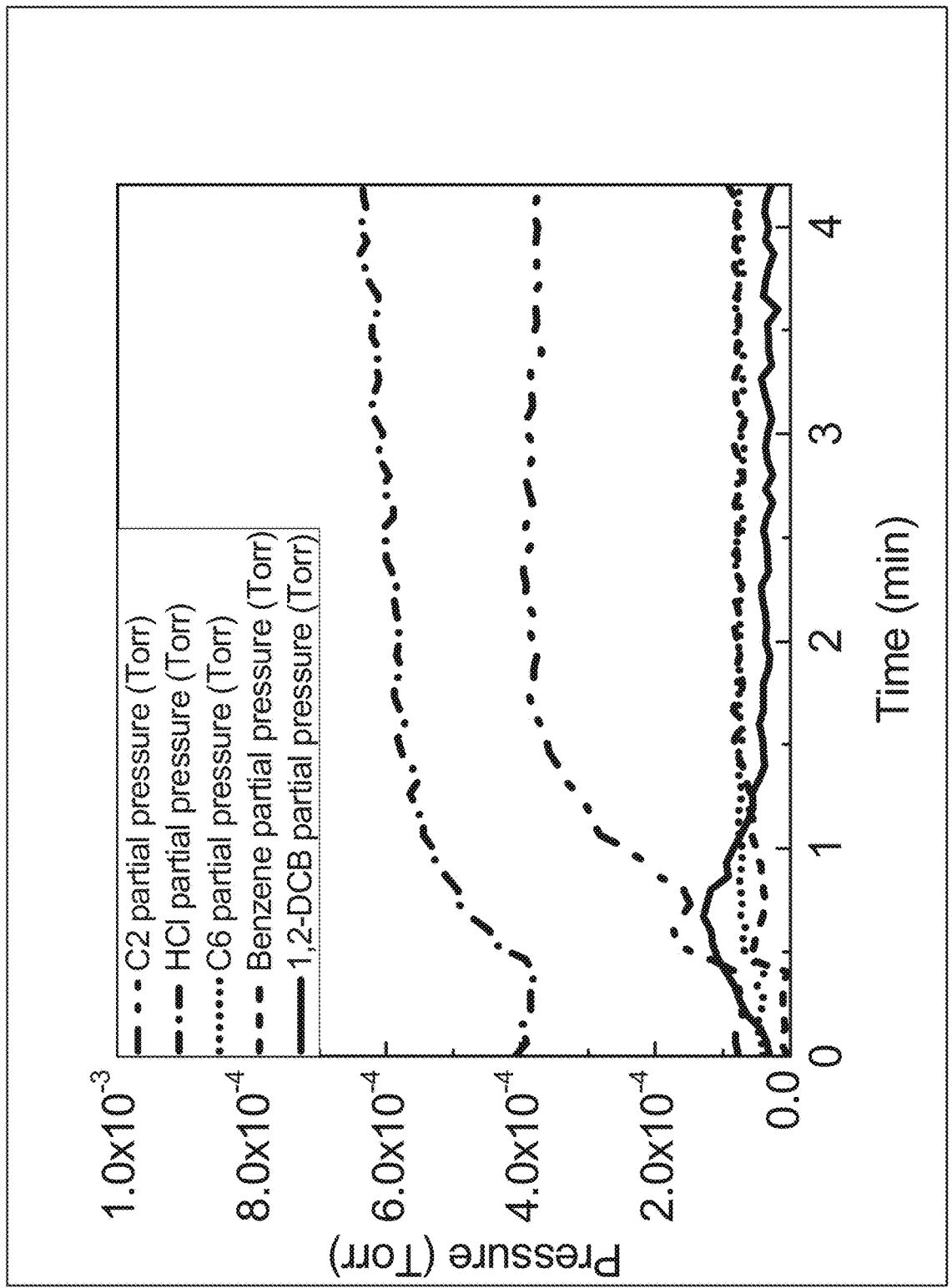
FIG. 10 is a plot illustrating partial gas pressures as a function of time during graphene nanostripe growth with a small precursor concentration ratio according to an embodiment of the present invention.

Additionally, the prominent presence of $C_6$ radicals and $C_6H_6$ molecules in the plasma growth process as illustrated in FIG. 10 is likely important for increasing the growth rate and yield of graphene nanostripes because graphene structures can be more effectively assembled from these molecules than from $C_2$ radicals alone. Accordingly, the inventors believe, without limiting embodiments of the present invention, that both 1,2-DCB precursor molecules and the resulting $C_6$, $C_6H_6$, and chlorine radicals in hydrogen plasma are important for mediating rapid vertical growth of graphene nanostripes with large aspect ratios.

Figure 4D:
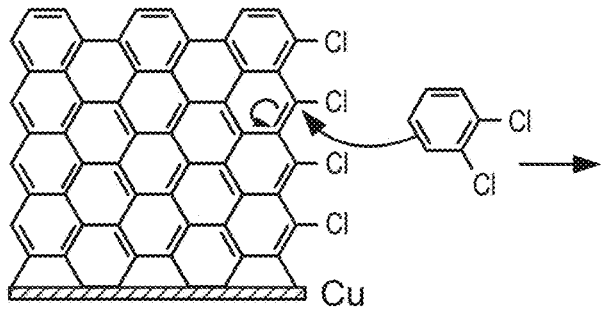
FIGS. 4D-4J are simplified schematic diagrams illustrating a mechanism for growth and branching of graphene nanostripes according to an embodiment of the present invention.
Figure 4E:
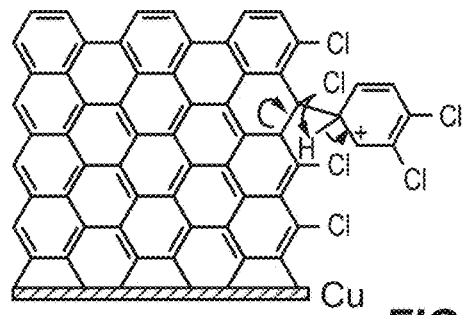
Figure 4G:
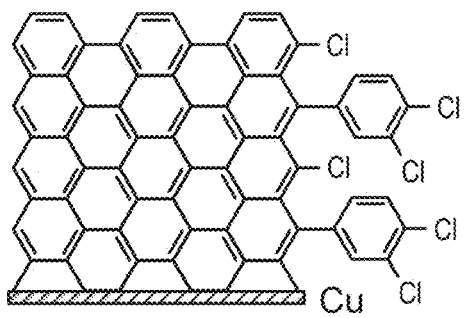
Figure 4F:
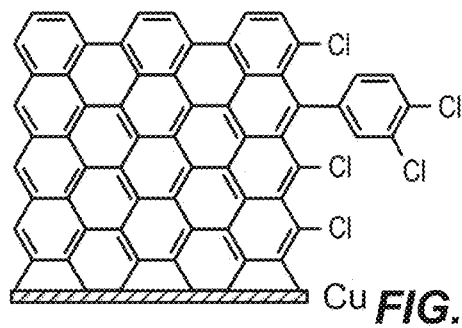
Figure 4H:
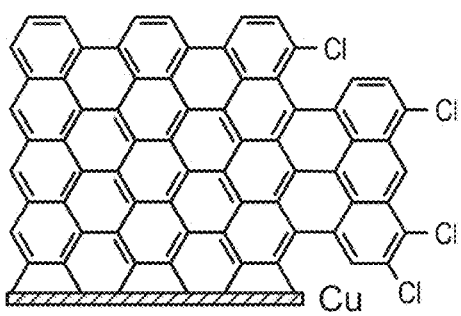
Figure 4I:
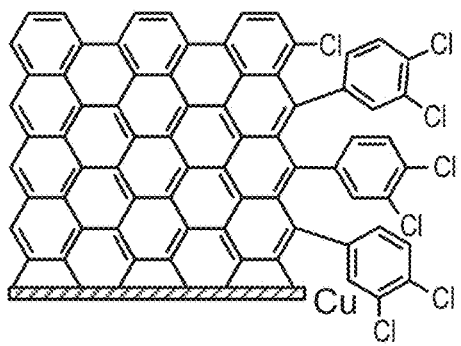
Figure 4J:
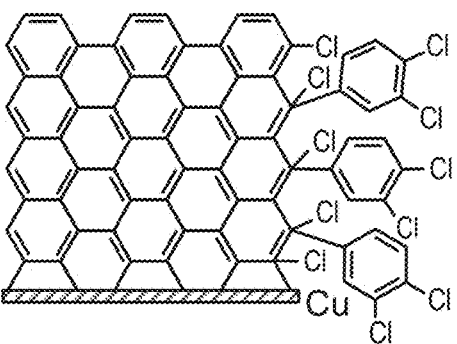

After initial vertical nucleation of a few honeycomb lattices on the copper substrate as illustrated in FIG. 4A, the graphene edges may be chlorine terminated due to chlorine radicals dissociated from 1,2-DCB. These chlorine terminated edges are chemically activated because of electron withdrawal from carbon atoms. Thus, electron-rich aromatic species (e.g., 1,2-DCB and its derivatives) can be drawn to the electron deficient carbon atoms. Given that the zigzag edges of graphene are more likely to react with chlorine or 1,2-DCB molecules due to steric hindrance at the armchair edges, we first consider the growth mechanism along the zigzag edges. As depicted in FIG. 4D, a 1,2-DCB molecule may attach to the graphene zigzag edge via nucleophilic aromatic substitution and produce HCl (FIG. 4E) by reaction with either nearby hydrogen atoms or hydrogen plasma to restore the $sp^2$ hybridization, as illustrated in FIG. 4F. The production of HCl is consistent with our RGA data, and restoring $sp^2$ hybridization is energetically favorable.

Conversely, the plasma processes may create radical-terminated graphene edges that react with radicals derived from 1,2-DCB. Furthermore, the 1,2-DCB molecule may react with hydrogen plasma and lose both chlorine atoms to become either benzene or $C_6$ radicals, which are highly reactive aromatics that could react with graphene edges.

Based on our RGA data discussed herein, all of these growth mechanisms may contribute the attachment of aromatic rings to graphene nanostripes. The aforementioned steps are repeated to yield the configuration shown in FIG. 4G. Finally, spatial gaps between edges with 1,2-DCB molecules attached can be filled in with carbon radicals dissociated from either methane or 1,2-DCB to complete the graphene lattice illustrated in FIG. 4H. When excess 1,2-DCB is present, the graphene edges may become saturated with 1,2-DCB molecules, i.e., 1,2-DCB molecules may attach to adjacent graphene edge sites as in FIG. 4I. Saturation of the graphene edges with 1,2-DCB molecules will necessarily result in strain and branching due to steric hindrance. The $sp^3$ branching at the strained graphene sites may be achieved by the attachment of chlorine radicals (FIG. 4J), which is consistent with our EDS observation that chlorine is primarily present at the branching sites of nanoflowers grown under excess 1,2-DCB.

On the other hand, when 1,2-DCB is relatively dilute, the graphene zigzag edges are more likely terminated by hydrogen, which could either react with the Cl atom in 1,2-DCB, release HCl while extending the length of graphene, or simply react with carbon radicals dissociated from either methane or 1,2-DCB to further the growth of graphene.

Figure 5:
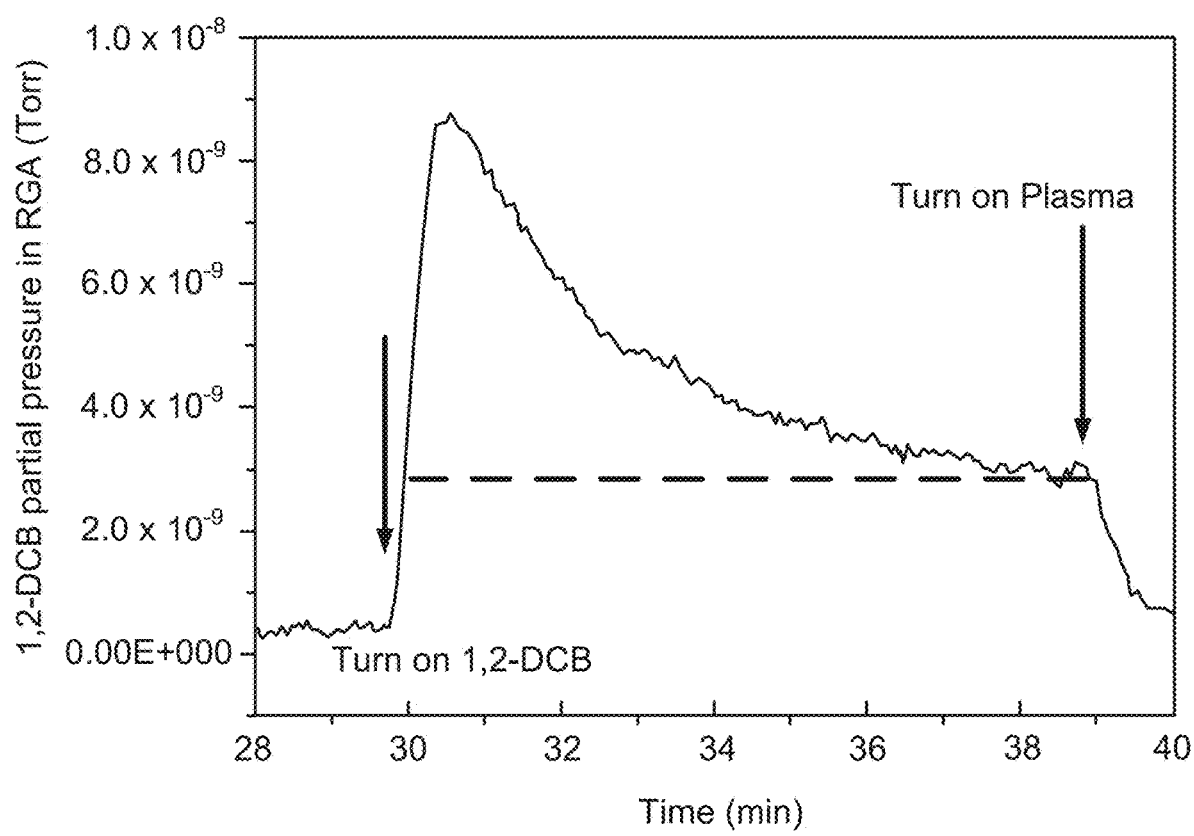
FIG. 5 is plot illustrating partial gas pressure of 1,2-DCB measured in the RGA as a function of time during graphene nanostripe growth according to an embodiment of the present invention.

FIG. 5 is plot illustrating partial gas pressure as a function of time during graphene nanostripe growth according to an embodiment of the present invention. The partial gas pressure recorded in FIG. 5 was measured in the RGA, not in the growth chamber. In FIG. 5, the 1,2-DCB partial pressure (e.g., measured using the RGA) is plotted as a function of time. When the 1,2-DCB is turned on, as illustrated at ~30 minutes, an initial, high 1,2-DCB partial pressure surge is observed, with the 1,2-DCB partial pressure increasing rapidly for approximately one minute and then decreasing. After a period of approximately nine minutes, the 1,2-DCB partial pressure reaches a stable state. As described herein, the inventors have determined that the turn-on sequence of the carbon containing precursors impacted the morphology of the graphene nanostripes. In particular, since most embodiments utilize a growth time of about 10 minutes, the high 1,2-DCB/$CH_4$ partial pressure ratio after initial turn on can saturate the substrate, lead to a high density of nucleation sites, and therefore, an overall decrease in the lateral size of the graphene nanostripes.

In an embodiment, the partial pressure reaching a stable state can be defined in terms of fitting an exponential decay to the partial pressure curve illustrated in FIG. 5 and stability is reached once the exponential decay term decreases to a predetermined multiple of the decay constant, for example, three times the decay constant. As an example, the partial pressure (y) as a function of time (t) can be determined by fitting the curve in FIG. 5:

$$y = 2.91 \times 10^{-9} + 5.06 \times 10^{-9} e^{-\frac{(t-31)}{2.25}}. \tag{1}$$

Accordingly, if stability is defined as a time period equal to three times the decay constant of 2.25 minutes, stability is reached in ~7 minutes.

Figure 6:
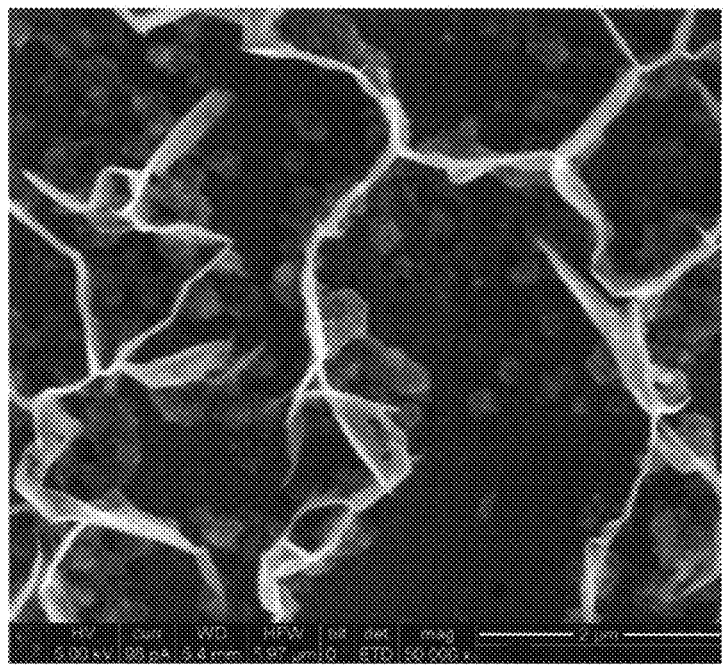
FIG. 6 is an SEM image of a graphene nanostripe structure grown with a small precursor concentration ratio according to an embodiment of the present invention.

FIG. 6 is an SEM image of a graphene nanostripe structure grown with a small precursor concentration ratio according to an embodiment of the present invention. During the growth of the graphene nanostripes illustrated in FIG. 6, the 1,2-DCB/$CH_4$ partial pressure ratio was 1.5. The total gas pressure was 500 mTorr and the flow rate of $H_2$ was 2 sccm. The $H_2$, $CH_4$, and 1,2-DCB/$CH_4$ partial pressure ratio were established in stable states (1,2-DCB partial pressure ratio kept constant at ~$3\times10^{-9}$ Torr, as measured in the RGA) and then the plasma (e.g., 60 W) was turned on. The resulting graphene nanostripes had typical lengths of a few microns to a few tens of microns and relatively large aspect ratios as shown in FIG. 6. As an example, the length:width aspect ratios of graphene nanostripes grown using embodiments of the present invention can range from 10:1 to 130:1. Similar results were achieved for 1,2-DCB/$CH_4$ partial pressure ratios less than 1.5.

Figure 7:
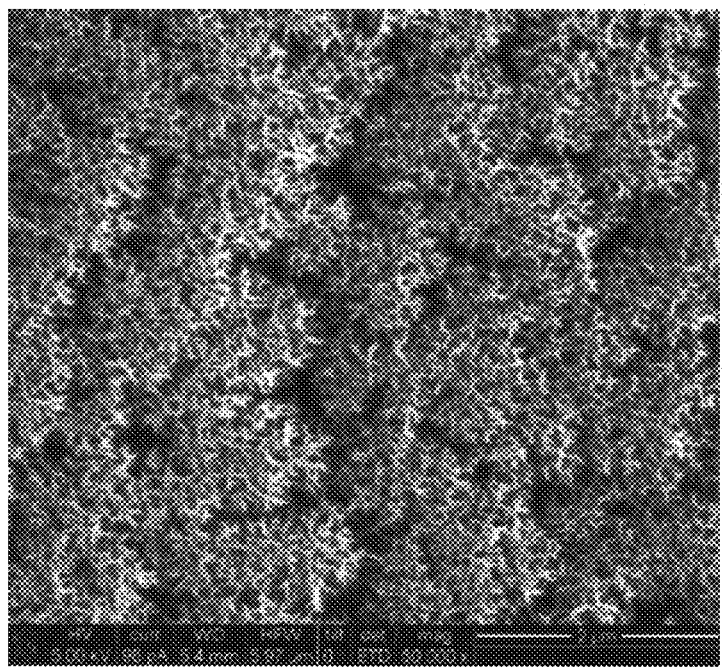
FIG. 7 is an SEM image of a graphene nanostripe structure grown with a large precursor concentration ratio according to an embodiment of the present invention.

FIG. 7 is an SEM image of a graphene nanostripe structure grown with a large precursor concentration ratio according to an embodiment of the present invention. During the growth of the graphene nanostripes illustrated in FIG. 7, the 1,2-DCB/$CH_4$ partial pressure ratio was 2.4. In this case, the plasma was turned on before the flow of the carbon containing precursor was initiated. As a result, growth occurred during the high partial pressure ratio surge illustrated in FIG. 5 at about 30 minutes. As shown in FIG. 7, the high partial pressure ratio growth regime resulted in graphene nanostripes with increased branching phenomena, giving rise to a highly branched, flower-like nanostructure.

These graphene "nano-flowers" were thinner and shorter than the typical graphene nanostripes grown with a smaller 1,2-DCB/CH$_4$ partial pressure ratio. This trend was in part attributed to the high 1,2-DCB concentration that saturated the substrate and led to a high density of nucleation sites and therefore an overall decrease in the lateral size of the graphene nanostripes. The branching behavior, in addition to the shorter lengths of the graphene nanostructures, may be attributed to the large amount of 1,2-DCB that resulted in excess chlorine ions terminated along the edges of the graphene nanostripes and activated the formation of the branching behavior. This scenario is consistent with studies of the ultraviolet photoelectron spectroscopy (UPS), TEM and energy-dispersive x-ray spectroscopy (EDS) of graphene nanostripes as conducted by the inventors. Thus, the morphology of the graphene nanostripes was strongly dependent on whether the carbon containing precursor (e.g., 1,2-DCB) was turned on before or after the plasma was turned on.

TEM images of the nano-flowers indicate that these structures generally consisted of a large number of layers, with numerous branching points and reorientations of the layers. A significant chlorine peak in the EDS data was observed at a large number of branching and reorientation locations in the nano-flower samples. This presence of a distinct chorine peak in a branching region of the nano-flowers is in stark contrast to the absence of any chlorine signal in the flat region of the same samples.

Figure 8:
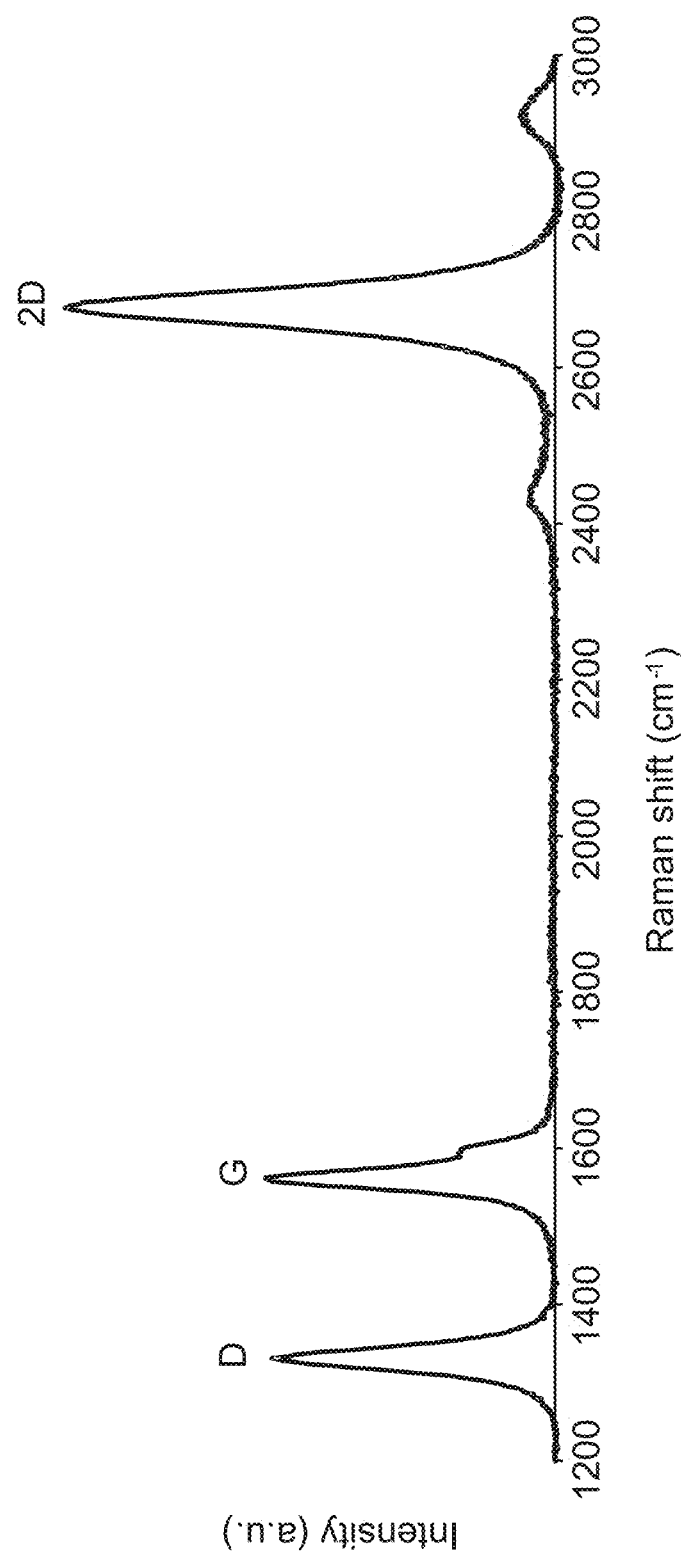
FIG. 8 is a Raman spectra for a graphene nanostripe structure grown with a small precursor concentration ratio according to an embodiment of the present invention.
Figure 9:
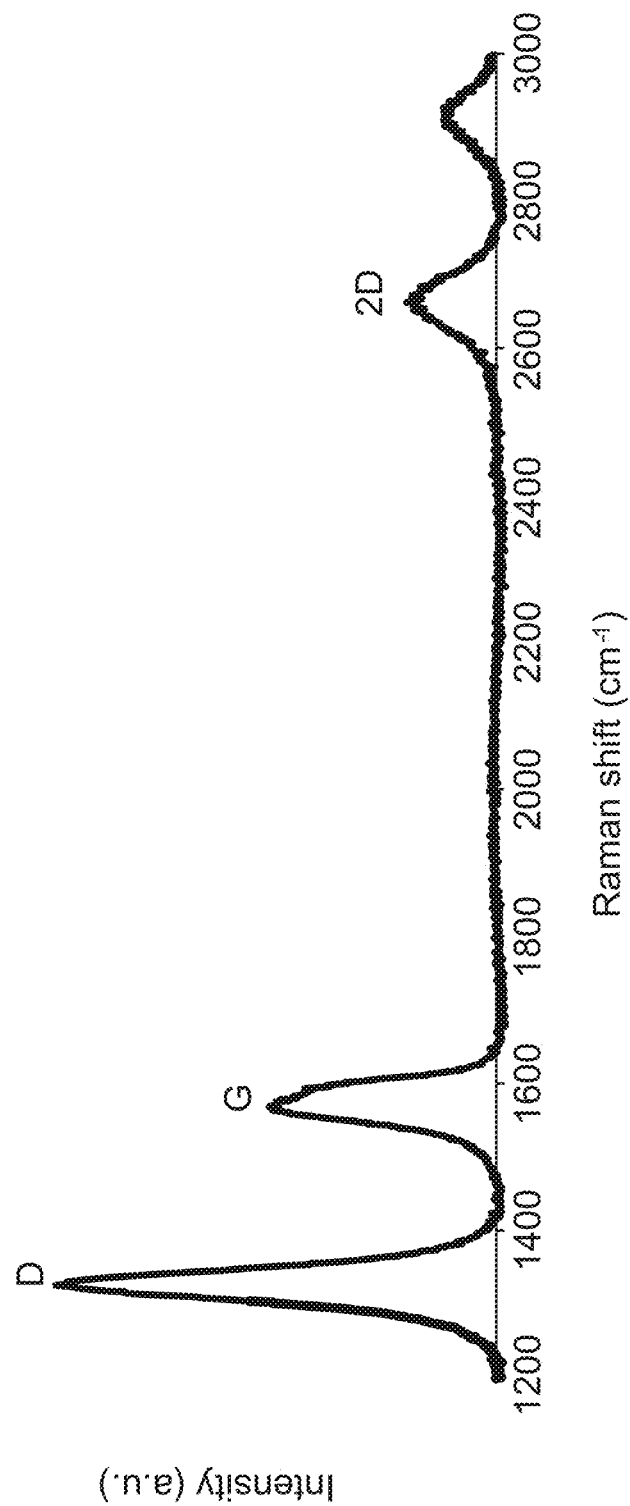
FIG. 9 is a Raman spectra for a graphene nanostripe structure grown with a large precursor concentration ratio according to an embodiment of the present invention.

FIG. 8 is a Raman spectra for a graphene nanostripe structure grown with a small precursor concentration ratio according to an embodiment of the present invention. The spectra illustrated in FIG. 8 was collected for a graphene nanostripe structure with a 1,2-DCB/CH$_4$ partial pressure ratio of 1.5. FIG. 9 is a Raman spectra for a graphene nanostripe structure grown with a large precursor concentration ratio according to an embodiment of the present invention. The spectra illustrated in FIG. 9 was collected for a graphene nanostripe structure with a 1,2-DCB/CH$_4$ partial pressure ratio of 2.4. Raman spectra were taken via a Renishaw M1000 micro-Raman spectrometer system using a 514.3 nm laser (2.41 eV) as the excitation laser source.

The peak at ~2,700 cm$^{-1}$ is known as the 2D-band that represents a double-resonance process of graphene; the peak at ~1,590 cm$^{-1}$ is the G-band associated with the doubly degenerate zone-center E$_{2g}$ mode of graphene, and the peak at ~1,350 cm$^{-1}$ is the D-band that corresponds to zone-boundary phonons due to defects, edges, and/or folds of graphene sheets. Given that the laser spot of the Raman spectrometer (~1 µm) is larger than the typical widths 10's to 100's of nanometers) of the graphene nanostripes, we attribute the intense D-band associated with the graphene nanostripes to the prevailing presence of edges and/or the presence of folds as observed in SEM and transmission electron microscopy (TEM) images. Further, the 2D-to-G intensity ratio, (I$_{2D}$/I$_G$), is typically greater than one and that the full-width-half-maximum (FWHM) of the 2D-band is relatively sharp, which seems to suggest that the graphene nanostripes are largely monolayer.

As can be determined by examining FIGS. 8 and 9, the 2D to G intensity ratios, (I$_{2D}$/I$_G$), and D to G intensity ratios, (I$_D$/I$_G$), vary for graphene nanostripes grown at different 1,2-DCB/CH$_4$ partial pressure ratios. The (I$_{2D}$/I$_G$) ratio decreases with the increase of 1,2-DCB/CH$_4$ partial pressure ratio, suggesting that more layers of graphene nanostripes were grown with larger amounts of 1,2-DCB. On the other hand, the (I$_D$/I$_G$) ratio increases with the increase of 1,2-DCB/CH$_4$ partial pressure ratio, which is consistent with more edges due to branching. Additionally, the in-plane sp$^2$ crystallite size (L$_\alpha$) of the GNSPs may be estimated by using the (I$_D$/I$_G$) ratio and the following empirical formula:

$$L_\alpha(\text{nm}) = \frac{560}{E_L^4}\left(\frac{I_D}{I_G}\right)^{-1}, \quad (2)$$

where E$_L$ denotes the excitation energy of the laser source, which is 514 nm for the Raman spectrometer utilized to obtain the data in FIGS. 8 and 9. The inventors have determined that the crystallite size L$_\alpha$ and the work function Φ of the graphene nanostripes decrease steadily with increasing 1,2-DCB/CH$_4$ partial pressure ratio.

FIG. 10 is a plot illustrating partial gas pressures as a function of time during graphene nanostripe growth with a small precursor concentration ratio according to an embodiment of the present invention. In the process characterized in FIG. 10, the flow of the carbon containing precursor (e.g., 1,2-DCB) was initiated before turning on the plasma. As a result, the gas pressures had stabilized as discussed in relation to FIG. 5, as illustrated at zero minutes in FIG. 10, before the plasma was initiated at 0.4 minutes, indicated by the shaded region of the plot. Total chamber pressure was 0.5 Torr, with the majority of the chamber pressure arising from the presence of hydrogen.

Figure 11:
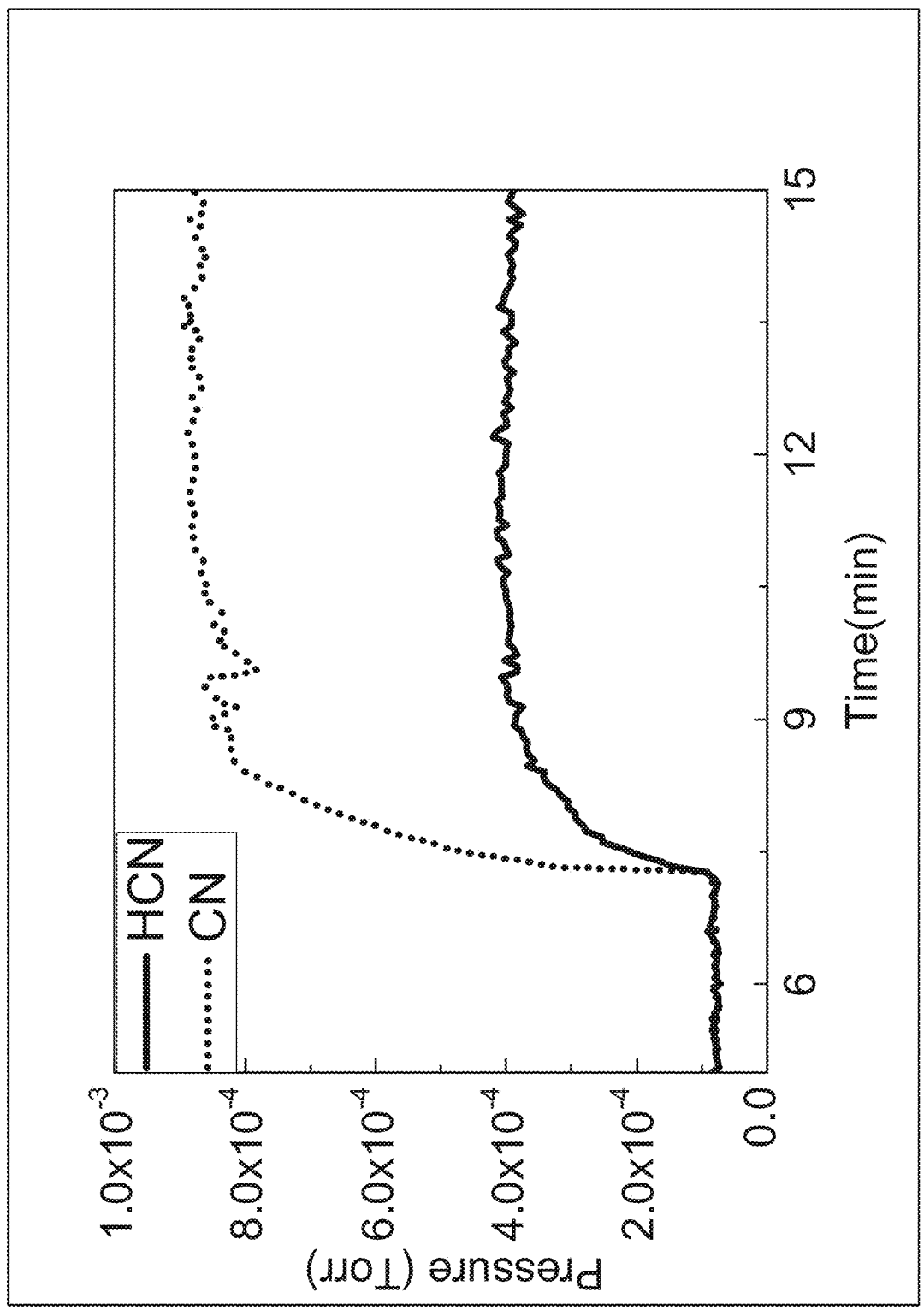
FIG. 11 is a plot illustrating additional partial gas pressures as a function of time during graphene nanostripe growth with a small precursor concentration ratio according to an embodiment of the present invention.

FIG. 11 is a plot illustrating additional partial gas pressures as a function of time during graphene nanostripe growth with a small precursor concentration ratio according to an embodiment of the present invention.

Referring to FIGS. 10 and 11, the use of the RGA to monitor the gases in the growth chamber during the PECVD process is illustrated. The spectrum in FIG. 10 reveals that hydrogen chloride (HCl) is a main byproduct of the PECVD graphene nanostripe growth process as 1,2-DCB in this embodiment is decomposed to form benzene rings and Cl, which reacts with free hydrogen. This indicates that hydrogen radicals can react with chlorine released from 1,2-DCB to form hydrogen chloride and render the resulting vertical GNSPs mostly free of chlorine. Additionally, substantial amounts of C$_2$ and C$_6$ radicals together with C$_6$H$_6$ molecules are found during the plasma growth process and are likely playing an important role in enhancing the aspect ratio of the graphene nanostripe because graphene structures can be more effectively assembled from these molecules. It should be noted that while C$_2$ are radicals present in thermally assisted CVD growth, the presence of C$_6$ radicals and C$_6$H$_6$ molecules are unique to the low-temperature PECVD process described herein as plasma enhanced formation of C$_6$ and C$_6$H$_6$ occurs as the C$_6$-containing precursors are decomposed in hydrogen plasma.

In FIG. 10, the benzene pressure in the processing chamber is substantially zero prior to initiation of the plasma, sharply increases when the plasma is initiated, and stabilizes at a pressure of ~1×10$^{-4}$ Torr as the growth process proceeds. The generation or production of benzene during the growth process results from the plasma enhanced nature of the growth process and distinguishes embodiments of the present invention from thermal CVD processes.

As illustrated in FIG. 11 and discussed in relation to FIG. 4A, CN and HCN radicals are produced when the plasma is turned on, thereby cleaning the substrate surface in preparation for graphene growth. It should be noted that since the HCl partial pressure in the residual gas analyzer is represented by mass 36, the presence of other gases with mass near 36 (e.g., argon, CCl$_4$, H$_2$S, and propyne (CH$_3$—

C═CH)) can result in an artificially high measurement of background mass 36 partial pressure before turning on the hydrogen plasma, particularly because argon gas has been used for flushing the growth chamber before the synthesis of GNSPs. Accordingly, as shown in FIG. 10, the adjusted increase in HCl partial pressure during growth is indicated.

Figure 12:
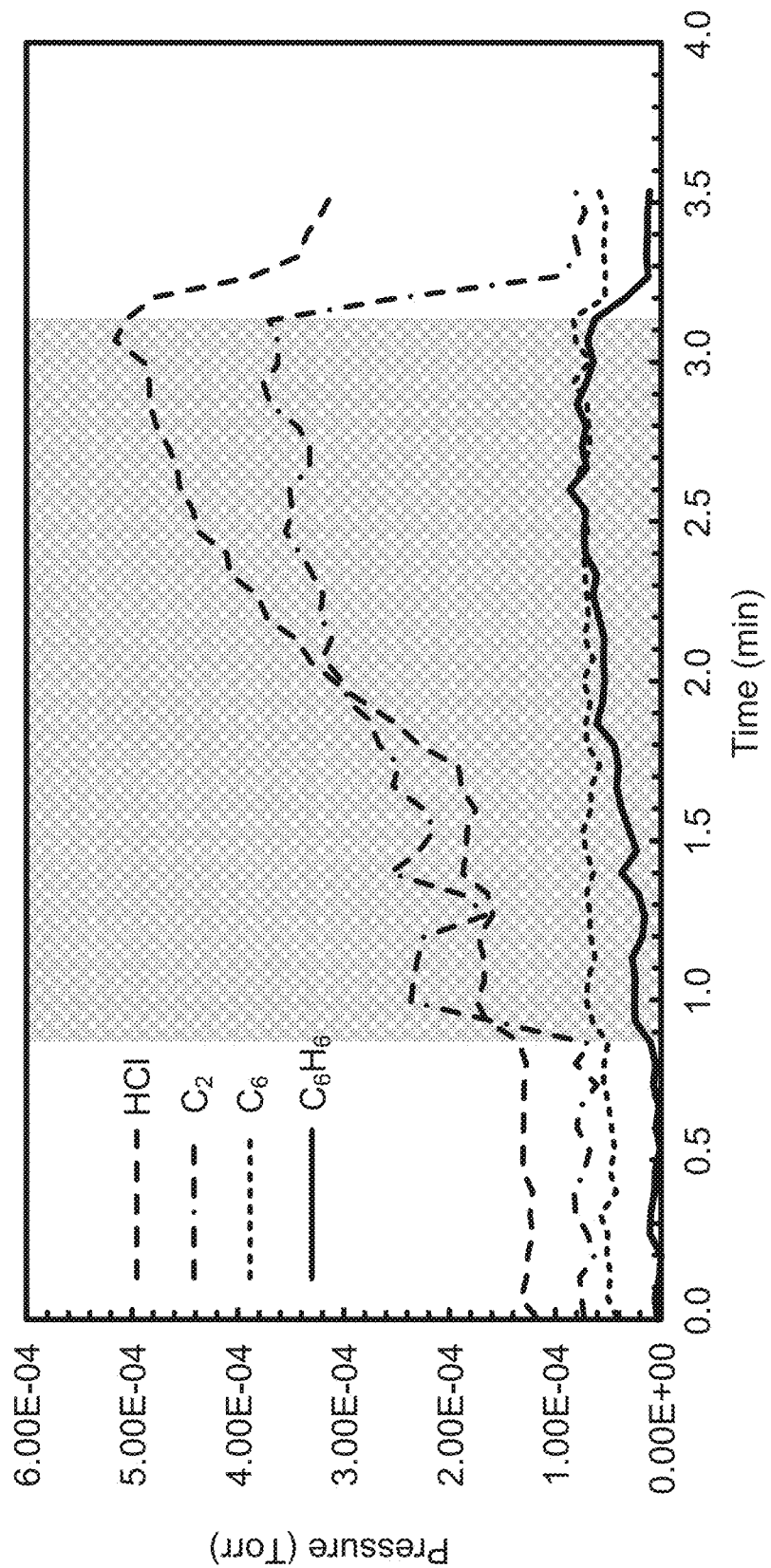
FIG. 12 is a plot illustrating additional partial gas pressures as a function of time during graphene nanostripe growth with a large precursor concentration ratio according to an embodiment of the present invention.

FIG. 12 is a plot illustrating additional partial gas pressures as a function of time during graphene nanostripe growth with a large precursor concentration ratio according to an embodiment of the present invention. In the process characterized in FIG. 12, the flow of the carbon containing precursor (e.g., 1,2-DCB) was initiated after turning on the plasma. As a result, the gas pressures are generally increasing during the plasma exposure, indicated by the shaded region of the plot. Total chamber pressure was 0.5 Torr, with the majority of the chamber pressure arising from the presence of hydrogen. In comparison with FIG. 10, the HCl pressure at zero minutes in FIG. 12 is approximately ¼ of the HCl pressure at zero minutes illustrated in FIG. 10, with the HCl pressure continuously increasing and only reaching levels shown in FIG. 10 at the end of the growth process in FIG. 12.

In FIG. 12, the benzene pressure in the processing chamber is substantially zero prior to initiation of the plasma and begins increasing when the plasma is initiated. The benzene pressure continues to increase during the growth process as the 1,2-DCB is decomposed and reaches pressures of $\sim 1 \times 10^{-4}$ Torr as the growth process proceeds. After the plasma is terminated, the benzene pressure drops rapidly as the plasma enhanced growth process terminates.

In FIG. 12, the gas pressures have reached a steady state, i.e., stabilized, prior to exposing the substrate to plasma, indicated by the unshaded region between 0 minutes and ~0.9 minutes. Accordingly, when the plasma exposure is initiated, pressure changes for the gases results from the plasma enhanced growth process, not variations in process inputs associated with stabilization of gas flow rates. As illustrated in FIG. 4B and FIG. 12 when considered together, plasma enhanced breaking of the 1,2-DCB bonds results in the formation of HCl, which starts increasing in concentration in the processing chamber coincident with plasma exposure, and in the decomposition of 1,2-DCB as the plasma enhanced bond breaking occurs. After the plasma is turned off, the 1,2-DCB pressure increases and the HCl pressure decreases as the plasma enhanced growth process is terminated.

Figures 13A, 13B, 13C:
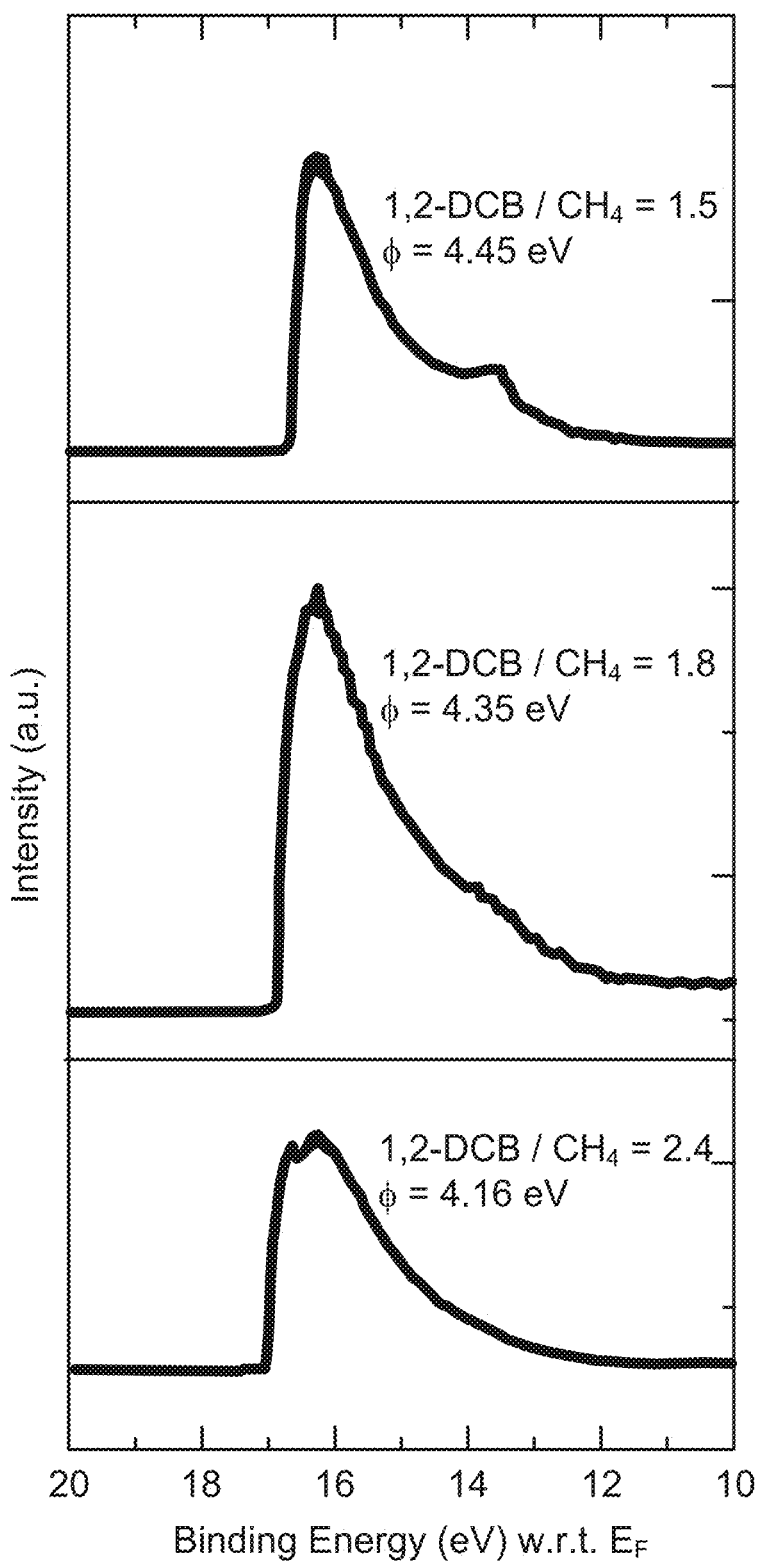
FIGS. 13A-13C are plots of ultraviolet photoemission spectroscopy data collected under differing graphene nanostripe growth conditions according to an embodiment of the present invention.

FIGS. 13A-13C are plots of ultraviolet photoemission spectroscopy (UPS) data collected under differing graphene nanostripe growth conditions according to an embodiment of the present invention. In FIGS. 13A-13C, the 1,2-DCB/$CH_4$ partial pressure ratio is 1.5, 1.8 and 2.4, respectively. The UPS measurements were performed via the Kratos-Ultra-XPS model, which uses a magnetic immersion lens with a spherical mirror and concentric hemispherical analyzers with a delay-line detector for both imaging and spectroscopy. He I (21.2 eV) were used as excitation sources for UPS measurement in an ultrahigh vacuum chamber with a base pressure of $2 \times 10^{-10}$ Torr.

UPS experiments were conducted to investigate the work functions of GNSPs grown under different 1,2-DCB/$CH_4$ partial pressure ratios and to provide direct information about possible doping effects on GNSPs. As shown in FIG. 13A, the work function value ($\Phi$) deduced from the secondary electron cutoff of the UPS spectrum was found to be 4.45 eV for GNSPs grown with a 1,2-DCB/$CH_4$ partial pressure ratio=1.5, which is a value close to that of pristine graphene (~4.5 eV). The work function value decreased to 4.16 eV for GNSPs grown with a 1,2-DCB/$CH_4$ partial pressure ratio increased to 2.4, implying significant electron doping. This finding suggests that excess 1,2-DCB not only resulted in the formation of branches and excess chlorine in the GNSPs (see TEM and EDS results) but also introduced additional electron doping. Thus, as illustrated in FIGS. 13A-13C, as the partial pressure ratio increases, the ultraviolet photoelectron spectroscopy (UPS) data shows increasing electron doping.

The inventors characterized nanoscale structural properties and chemical compositions of the PECVD-grown GNSPs by means of TEM and EDS. Measurements were initially performed on standard GNSPs similar to those shown in FIG. 6 that were grown with a 1,2-DCB/$CH_4$ partial pressure ratio ~1.5.

Figure 15A:
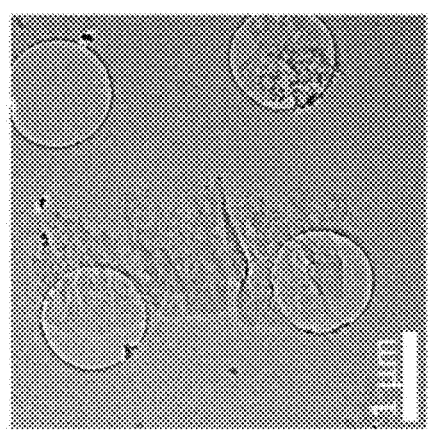
FIGS. 15A-15C are TEM top view images of GNSPs with successively increasing resolution from large scale to atomic scale images.
Figure 15B:
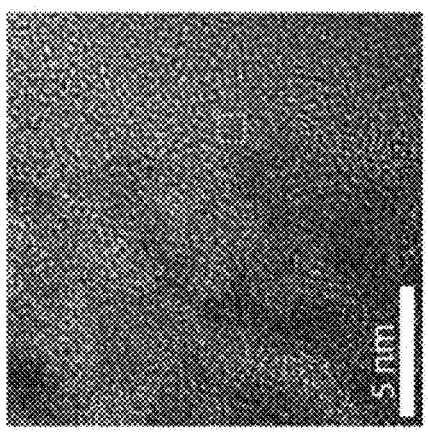
Figure 15C:
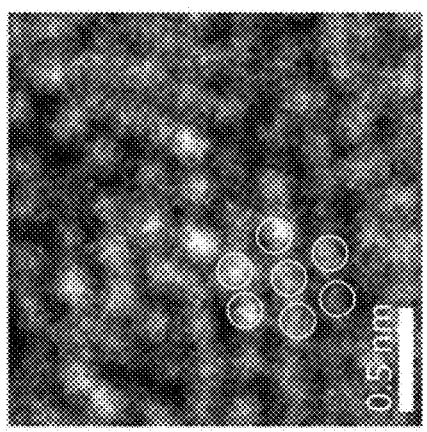

FIGS. 15A-15C are TEM top view images of GNSPs with successively increasing resolution from large scale (FIG. 15A) to atomic scale (FIG. 15C) images. FIG. 15C is an increased resolution image of the region indicated by the box in FIG. 15B. From these detailed TEM studies, the inventors determined that the typical size of GNSPs transferred to the TEM grid was 500 nm-1.0 μm in width and 5~10 μm in length, as exemplified in FIG. 15A. The shorter lengths than those of the as grown GNSPs may be attributed to the TEM sample preparation steps that involved sonication of GNSPs in solution that led to shortened samples.

As illustrated in FIG. 15B, the GNSPs were generally flat over large areas and exhibited ordered nanoscale structures. High resolution images taken on these flat areas further revealed graphene atomic lattice structures, as shown in FIG. 15C. The inventors determined that the GNSPs were mostly multilayers and turbostratic.

Figure 15D:
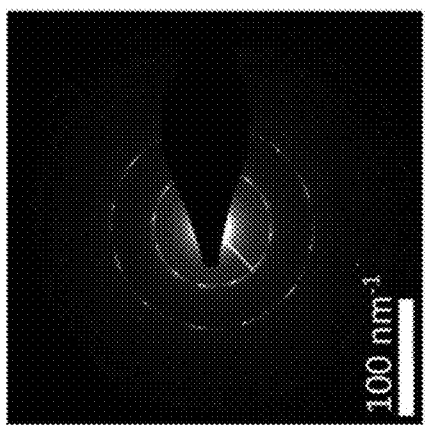
FIG. 15D is a selected area diffraction (SAD) pattern of GNSPs for the region shown in FIG. 15C.

FIG. 15D is a selected area diffraction (SAD) pattern of GNSPs for the region shown in FIG. 15C. As shown by the SAD in FIG. 15D, the sample exhibited two predominant orientations and exceeded six layers in thickness. This finding of multilayer GNSPs seems to differ from Raman spectroscopic studies of the same GNSPs that revealed both $(I_{2D}/I_G)$ ratios >1 and relatively small FWHM in the 2D-band and so would seem to imply monolayer GNSPs. However, it should be noted that the Raman spectra of multilayer graphene sheets with turbostratic stacking (where individual layers separated by a larger than normal interlayer distance) were also found to exhibit $(I_{2D}/I_G)$ ratios >1. Therefore, the results demonstrated from the TEM results illustrated in FIGS. 15A-C for standard GNSPs can be reconciled with the Raman spectroscopic studies.

Figure 15E:
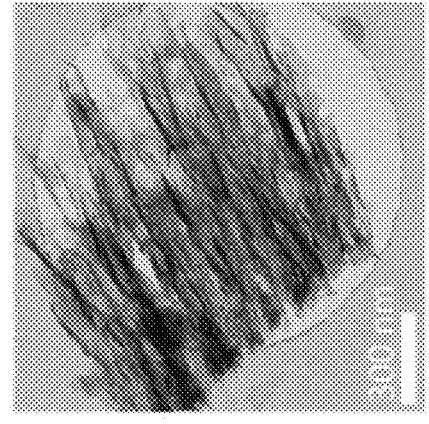
FIGS. 15E-15G are TEM top view images of graphene nanoflowers from large scale to atomic scale images.
Figure 15F:
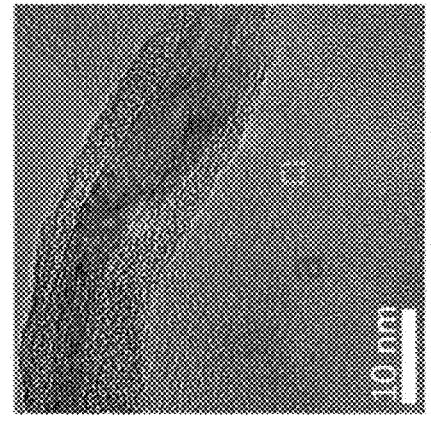
Figure 15G:
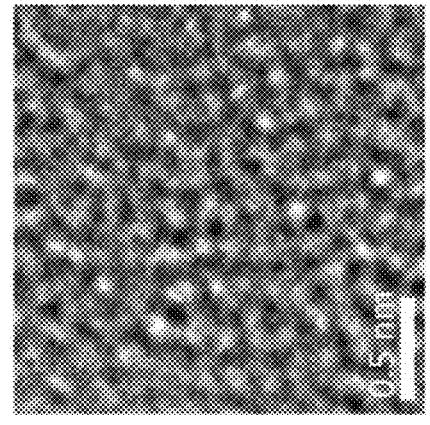

FIGS. 15E-15G are TEM top view images of graphene nanoflowers from large scale (FIG. 15E) to atomic scale (FIG. 15G) images. FIG. 15G is an increased resolution image of the region indicted by the box in FIG. 15F. Measurements were initially performed on nano-flower GNSPs similar to those shown in FIG. 7 that were grown with a 1,2-DCB/$CH_4$ partial pressure ratio ~2.3. In contrast to the images taken on standard GNSPs, FIGS. 15E and 15F reveal that nano-flowers generally consisted of a large number of layers, with numerous branching points and reorientations of the layers. In particular, FIG. 15F shows that in the reoriented graphene region, the number of graphene layers within the field of view is >20, whereas graphene atomic structures can be resolved in flat regions, as exemplified in FIG. 15G.

Figure 15H:
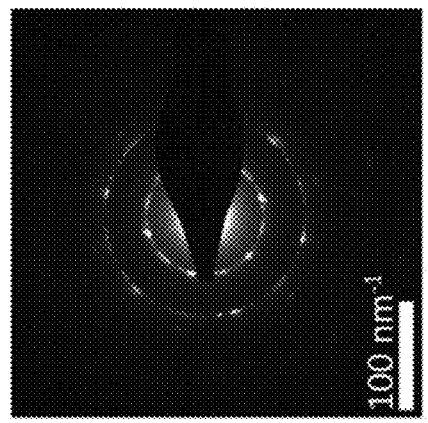
FIG. 15H is a SAD pattern of the sample region shown in FIG. 15G according to an embodiment of the present invention.

FIG. 15H is a SAD pattern of the sample region shown in FIG. 15G. In this flat region of the sample (region a in FIG. 15F), a diffraction pattern is exhibited that provides evidence for multiple layers, with varying orientations for many individual graphene layers that lead to the disordered circular pattern.

In addition to studies of the structural properties, nanoscale EDS measurements were made on flat, unstrained regions of these standard GNSPs, and found a pure carbon composition without any chlorine or other contaminates. This finding is in contrast to studies of the nano-flower samples where chlorine appeared in regions with bifurcations, branching or strain, as explained below.

Figure 16:
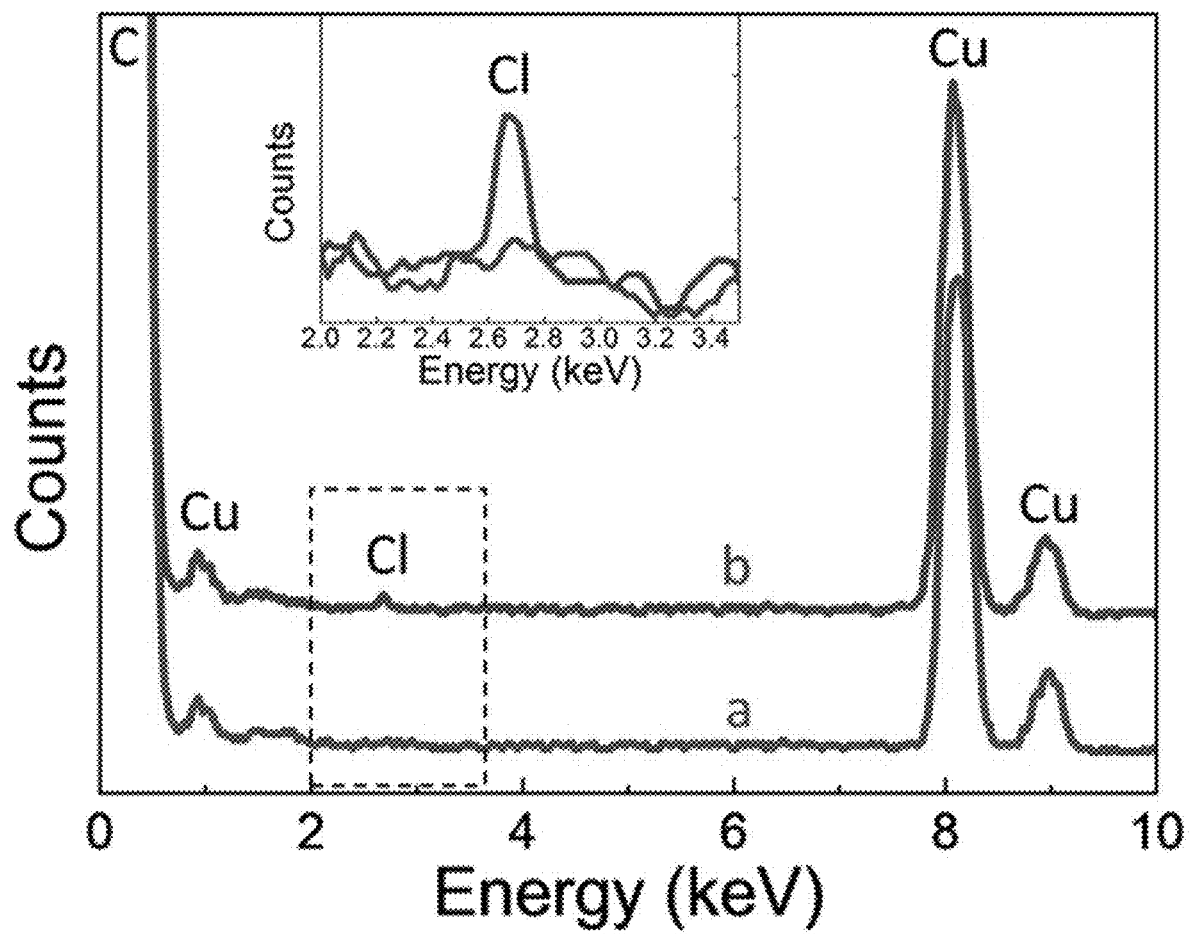
FIG. 16 is a plot showing Energy-dispersive X-ray spectroscopy (EDS) data for different regions of a GNSP according to an embodiment of the present invention.

FIG. 16 is a plot showing Energy-dispersive X-ray spectroscopy (EDS) data for different regions of a GNSP according to an embodiment of the present invention. Plot a in FIG. 16 was obtained by characterizing region a in FIG. 15F, which is a flat region of the sample. Plot b in FIG. 16 was obtained by characterizing region b in FIG. 15F, which is a branching region of the sample. The inset in FIG. 16 is an expansion of the dashed area shown in the main panel.

Plot b in FIG. 16 shows a distinct chlorine peak in a branching region, which is in stark contrast to the absence of chlorine in flat areas such as the flat region labeled by region a in FIG. 15F. On the other hand, in the branching region of the sample (region b in FIG. 15F), a significant chlorine peak in the EDS data is observed in conjunction with a large number of branching and reorientation locations in the nano-flower samples as exemplified in FIG. 16. Thus, this presence of a distinct chorine peak in a branching region of the nano-flowers is in stark contrast to the absence of any chlorine signal in the flat region of the same samples.

In order to achieve high yields of GNSPs growth, we experimented various parameters for synthesizing typical GNSPs with 1,2-DCB/$CH_4$ partial pressure ratios $<\sim 1$, as summarized in Table 1. We found that the yield of GNSPs, determined in units of mass per unit area, increased by more than one order of magnitude when the power was increased from 40 W to 60 W. This finding may be attributed to the presence of more energetic gas molecules and radicals (particularly $C_2$, $C_6$ and $C_6H_6$) in the plasma to initiate and maintain the growth of GNSPs. Additionally, higher $CH_4$ partial pressure and longer growth time provided more carbon sources and therefore also help increase the yield of GNSPs. On the other hand, further increase of either the plasma power above 60 W or the $CH_4$ partial pressure could not result in higher yields, which may be the result of a limited surface area of the Cu substrate in our growth chamber for initiating the vertical growth of GNSPs. Moreover, excess plasma power tends to increase the amount of $C_2$ radicals at the expense of reducing the amount of $C_6$ radicals and $C_6H_6$ molecules. Given that $C_6$ radicals and $C_6H_6$ molecules are likely playing an important role in enhancing the growth rate of GNSPs, proper balance between the plasma power and the amount of $C_6$ and $C_6H_6$ is necessary to achieve high yields of GNSPs.

TABLE 1

Experimental parameters for the growth process, showing the gas partial pressures (measured in the RGA) of 1,2-DCB and $CH_4$, plasma power, and time for the PECVD growth of GNSPs.

| 1,2-DCB ($10^{-9}$ Torr) | $CH_4$ ($10^{-9}$ Torr) | Power (W) | Growth time (min) | Yield (μg) |
|---|---|---|---|---|
| 1~10 | 10~40 | 40 | 10 | <1 |
| 1~10 | 10~40 | 60 | 10 | 12 ± 6 |
| 1~10 | 900 | 60 | 5 | 250 ± 280 |
| 1~10 | 900 | 60 | 10 | 530 ± 130 |
| 1~10 | 900 | 60 | 15 | 800 ± 270 |

TABLE 1-continued

Experimental parameters for the growth process, showing the gas partial pressures (measured in the RGA) of 1,2-DCB and $CH_4$, plasma power, and time for the PECVD growth of GNSPs.

| 1,2-DCB ($10^{-9}$ Torr) | $CH_4$ ($10^{-9}$ Torr) | Power (W) | Growth time (min) | Yield (μg) |
|---|---|---|---|---|
| 1~10 | 900 | 60 | 20 | 1300 ± 430 |

Figure 17A:
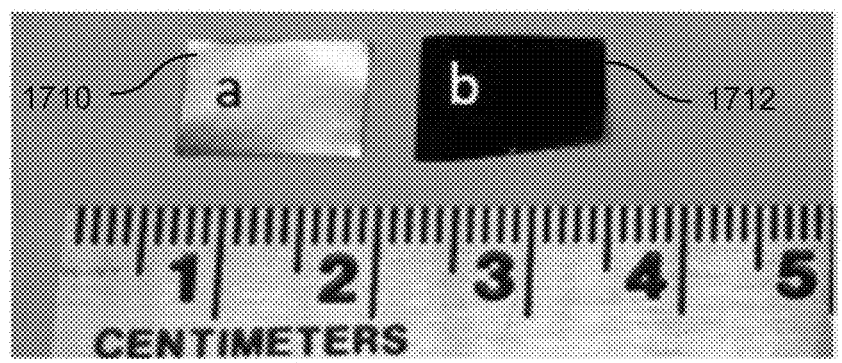
FIG. 17A illustrates optical micrographs prior to and after growth of GNSPs according to an embodiment of the present invention.
Figure 17B:
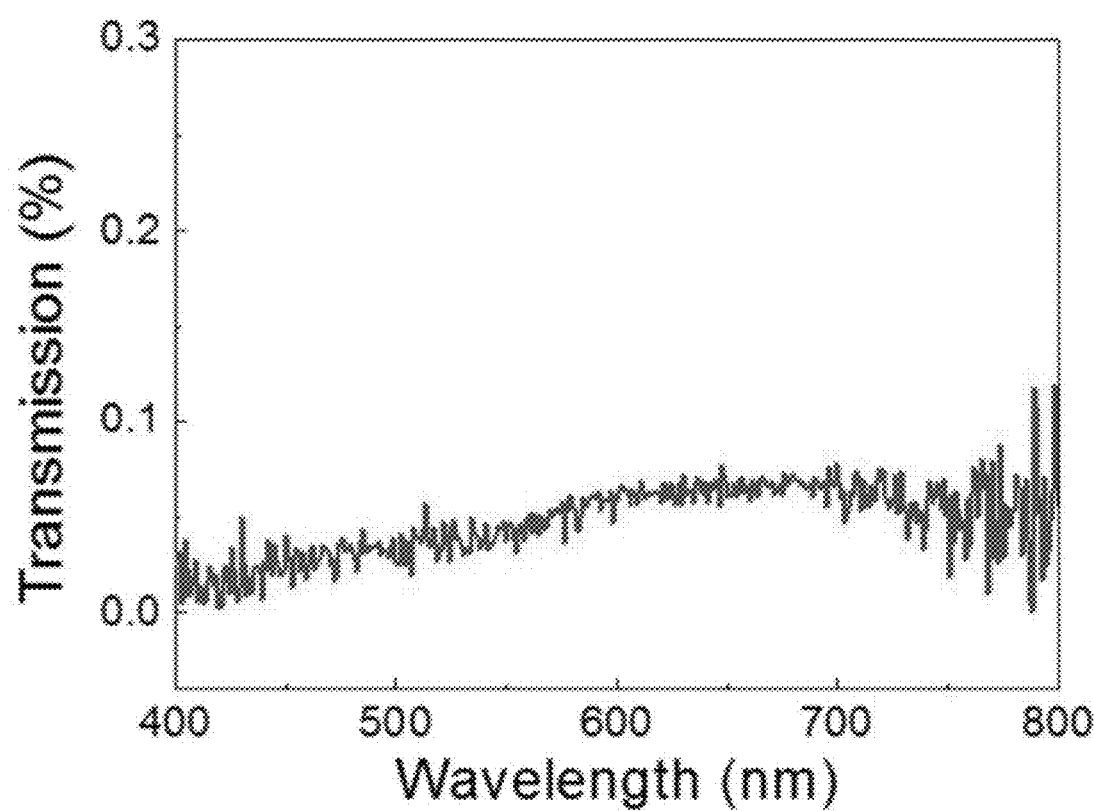
FIG. 17B is a plot showing transmission as a function of wavelength for GNSPs according to an embodiment of the present invention.

By optimizing various growth parameters, we found that the best yield for 20 minutes of growth time could reach (1.30±0.43) mg/cm$^2$, or equivalently, (13.0±4.3) g/m$^2$. The high-yield growth of GNSPs resulted in a completely darkened surface of the substrate due to dense coverage of GNSPs on the metallic substrate. FIG. 17A illustrates optical micrographs prior to and after growth of GNSPs according to an embodiment of the present invention. In FIG. 17A, the substrate prior to growth is illustrated by the sample 1710 marked (a) and the substrate after growth of GNSPs is illustrated by the sample 1712 marked (b). FIG. 17B is a plot showing transmission as a function of wavelength for GNSPs according to an embodiment of the present invention. The completely darkened substrate surface of sample 1712 by the coverage of GNSPs is indicative of strong light absorption by GNSPs, which may be attributed to effective light trapping in stacks of GNSPs due to multiple scattering and has been further corroborated by optical transmission spectroscopic measurements in FIG. 17B that reveal <0.1% of optical transmission for wavelengths from 400 nm to 800 nm. Thus, GNSPs may be considered as efficient light absorbers for potential applications to photovoltaic cells when combined with proper plasmonic nanostructures.

Figure 14:
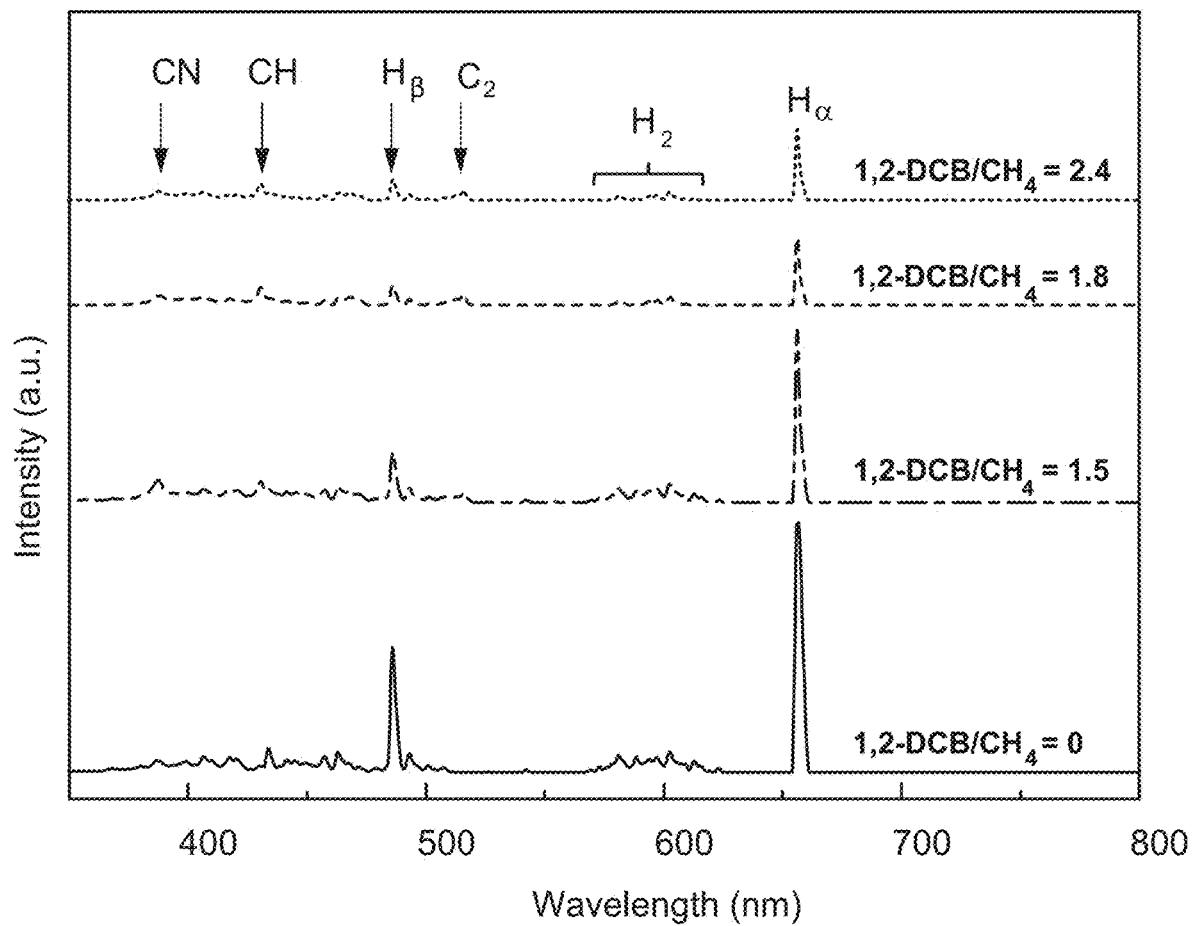
FIG. 14 shows plots of optical emission spectroscopy intensity as a function of wavelength for PECVD-grown graphene nanostripes under differing graphene nanostripe growth conditions according to an embodiment of the present invention.

FIG. 14 shows plots of optical emission spectroscopy intensity as a function of wavelength for PECVD-grown graphene nanostripes under differing graphene nanostripe growth conditions according to an embodiment of the present invention. In the optical emission spectroscopy (OES) plots shown in FIG. 14, the 1,2-DCB/$CH_4$ partial pressure ratios are 0, 1.5, 1.8, and 2.4, respectively. The OES peaks associated with CN (388 nm), CH (431 nm), $H_\beta$ (486 nm), $C_2$ (516 nm), and $H\alpha$ (656 nm) are shown. As illustrated in FIG. 14, the OES data demonstrates decreasing intensities of all hydrogen related peaks ($H_\alpha$, $H_2$, and $H_\beta$) with increasing 1,2-DCB/$CH_4$ partial pressure ratio, consistent with the reaction of hydrogen with increasing chlorine radicals. On the other hand, the intensity of $C_2$ radicals, which the inventors believe, without limiting embodiments of the present invention, is important for graphene growth, is enhanced upon the introduction of 1,2-DCB precursor molecules, although no further increase appears with increasing 1,2-DCB/$CH_4$ partial pressure ratio.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming vertical graphene nanostripes comprising one or several monolayers and characterized by a thickness normal to the one or several monolayers, a length orthogonal to the thickness, and a width orthogonal to the thickness, the method comprising:
   providing a transition metal substrate;
   subjecting the transition metal substrate to a reduced pressure environment in a processing chamber;

providing methane gas and a benzene ring precursor;
flowing the methane gas and the benzene ring precursor into the processing chamber;
establishing a partial pressure ratio of the benzene ring precursor to methane gas in the processing chamber, wherein the partial pressure ratio is between 0 and 3;
generating a plasma including benzene rings in the processing chamber;
thereafter, exposing the at least a portion of the transition metal substrate to the methane gas, the benzene rings, and the plasma; and
growing the vertical graphene nanostripes coupled to the at least a portion of the transition metal substrate, wherein one or more of the vertical graphene nanostripes are characterized by the thickness measured parallel to the transition metal substrate, the length extending parallel to the transition metal substrate in a first direction, and the width extending orthogonal to the transition metal substrate in a second direction, and an aspect ratio of the length to the width ranging from 10:1 to 130:1.

2. The method of claim 1 wherein the partial pressure ratio is between 1 and 2.

3. The method of claim 1 wherein exposing the at least a portion of the transition metal substrate to the methane gas, the benzene rings, and the plasma is performed concurrently with growing the vertical graphene nanostripes.

4. The method of claim 1 wherein the benzene ring precursor comprises a single benzene ring.

5. The method of claim 4 wherein growing the vertical graphene nanostripes coupled to the at least a portion of the transition metal substrate comprises bonding of the single benzene ring to the transition metal substrate with carbon atoms of the single benzene ring aligned with the length and the width of the vertical graphene nanostripes.

6. The method of claim 5 wherein growing the vertical graphene nanostripes coupled to the at least a portion of the transition metal substrate further comprises bonding of additional benzene rings to previously bonded benzene rings with carbon atoms of the additional benzene rings aligned with the length and the width of the vertical graphene nanostripes.

7. The method of claim 1 wherein the benzene ring precursor comprises 1,2-dichlorobenzene (1,2-DCB) gas.

8. The method of claim 1 further comprising generating CN radicals, nitrogen radicals, nitrogen oxide radicals, carbon oxides, or carbon oxide radicals in the processing chamber concurrently with:
providing methane gas;
exposing the at least a portion of the transition metal substrate to the methane gas, the benzene rings, and the; and
growing the vertical graphene nanostripes.

9. A method of forming vertical graphene nanostripes comprising one or several monolayers and characterized by a thickness normal to the one or several monolayers, a length orthogonal to the thickness, and a width orthogonal to the thickness, the method comprising:
providing a transition metal substrate;
subjecting the transition metal substrate to a reduced pressure environment in a processing chamber;
providing methane gas and a carbon containing precursor including a single benzene ring;
flowing the methane gas and the carbon containing precursor including the single benzene ring into the processing chamber;
establishing a partial pressure ratio of the carbon containing precursor including the single benzene ring to methane gas in the processing chamber;
generating a plasma including a plurality of single benzene rings;
exposing at least a portion of the transition metal substrate to the methane gas, the plurality of single benzene rings, and the plasma; and
growing the vertical graphene nanostripes coupled to the at least a portion of the transition metal substrate, wherein the thickness of the vertical graphene nanostripes extends parallel to the transition metal substrate.

10. The method of claim 9 wherein the partial pressure ratio ranges from 0 to 3.

11. The method of claim 10 wherein the partial pressure ratio is between 1 and 2.

12. The method of claim 9 wherein the carbon containing precursor including the single benzene ring comprises 1,2-dichlorobenzene (1,2-DCB) gas.

13. The method of claim 9 wherein exposing the at least a portion of the transition metal substrate to the methane gas, the carbon containing precursor, and the plasma is performed concurrently with growing the vertical graphene nanostripes.

14. The method of claim 9 wherein growing the vertical graphene nanostripes coupled to the at least a portion of the transition metal substrate comprises bonding of the single benzene rings to the transition metal substrate with carbon atoms of the single benzene rings aligned with the length and the width of the vertical graphene nanostripes.

15. The method of claim 14 wherein growing the vertical graphene nanostripes coupled to the at least a portion of the transition metal substrate further comprises bonding of additional single benzene rings to previously bonded benzene rings with carbon atoms of the additional single benzene rings aligned with the length and the width of the vertical graphene nanostripes.

16. The method of claim 9 further comprising providing hydrogen gas and generating HCl in the processing chamber concurrently with:
exposing the at least a portion of the transition metal substrate to the methane gas, the carbon containing precursor, and the plasma; and
growing the vertical graphene nanostripes.

17. The method of claim 9 further comprising generating CN radicals, nitrogen radicals, nitrogen oxide radicals, carbon oxides, or carbon oxide radicals in the processing chamber concurrently with:
providing a gas including nitrogen;
exposing the at least a portion of the transition metal substrate to the methane gas, the gas including nitrogen, the carbon containing precursor, and the plasma; and
growing the vertical graphene nanostripes.

18. The method of claim 9 wherein the one or several monolayers consist of one monolayer.

19. The method of claim 9 wherein the length extends parallel to the transition metal substrate in a direction orthogonal to the thickness, the width extends orthogonal to the transition metal substrate, and an aspect ratio of the length to the width ranges from 10:1 to 130:1.

20. The method of claim 9 further comprising generating $C_2$ radicals during exposing the at least a portion of the transition metal substrate to the methane gas, the plurality of single benzene rings, and the plasma.

* * * * *